United States Patent [19]

Ohtoshi et al.

[11] Patent Number: 5,539,211

[45] Date of Patent: Jul. 23, 1996

[54] CHARGED BEAM APPARATUS HAVING CLEANING FUNCTION AND METHOD OF CLEANING CHARGED BEAM APPARATUS

[75] Inventors: Kenji Ohtoshi, Funabashi; Itsuko Sakai, Kawasaki; Yuichiro Yamazaki, Tokyo; Jun Takamatsu, Asaka; Munehiro Ogasawara, Fujisawa; Kazuyoshi Sugihara, Yokosuka, all of Japan

[73] Assignee: Kabushiki Kaisha Toshiba, Kawasaki, Japan

[21] Appl. No.: 365,825

[22] Filed: Dec. 29, 1994

[30] Foreign Application Priority Data

Dec. 29, 1993 [JP] Japan ................................. 5-350968
Jul. 6, 1994 [JP] Japan ................................. 6-154805
Sep. 17, 1994 [JP] Japan ................................. 6-248477
Dec. 16, 1994 [JP] Japan ................................. 6-313715

[51] Int. Cl.$^6$ ............................... H01J 37/18; B08B 7/00
[52] U.S. Cl. ........................ 250/441.11; 134/1.1
[58] Field of Search ............................ 250/441.11; 134/1, 134/1.1

[56] References Cited

U.S. PATENT DOCUMENTS 5,312,519  5/1994  Sakai et al. ............................ 134/1.1

FOREIGN PATENT DOCUMENTS 1-22978  4/1989  Japan .
4-94524  3/1992  Japan .
5-144716  6/1993  Japan .

Primary Examiner—Jack I. Berman
Attorney, Agent, or Firm—Oblon, Spivak, McClelland, Maier & Neustadt

[57] ABSTRACT

A charged beam apparatus comprises a source tank provided outside the column and containing a plasma source, a plasma generating apparatus for generating plasma from a plasma source supplied from the source tank, gate valves and an exhausting pump for introducing plasma generated by the plasma generating apparatus into the column and for exhausting the plasma therefrom, and an O-ring for restricting a passage of plasma in the column such that those portions of cleaning portions to be cleaned to which internal contaminants stick are mainly exposed to plasma. Therefore, it is possible to generation of an oxide film, a fluoride film, or the likes which cause drifting can be restricted.

30 Claims, 23 Drawing Sheets

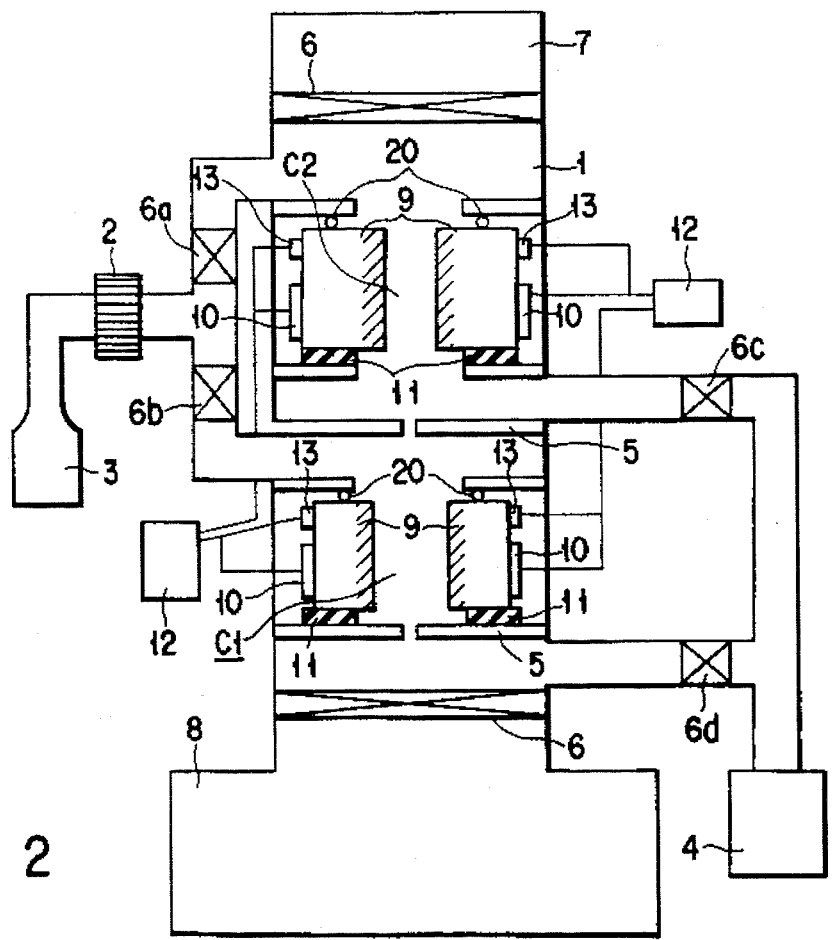
F I G. 2

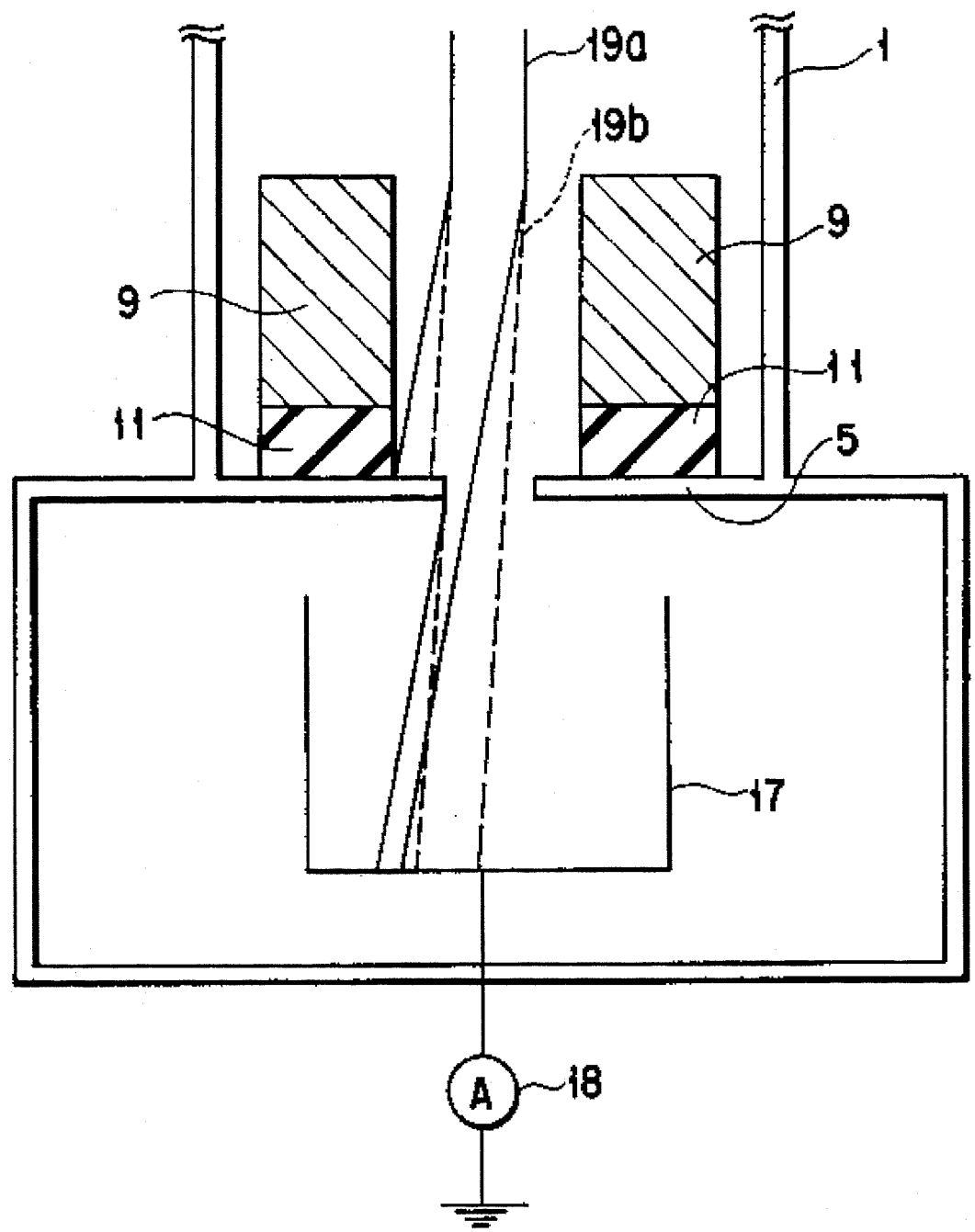
F I G. 8

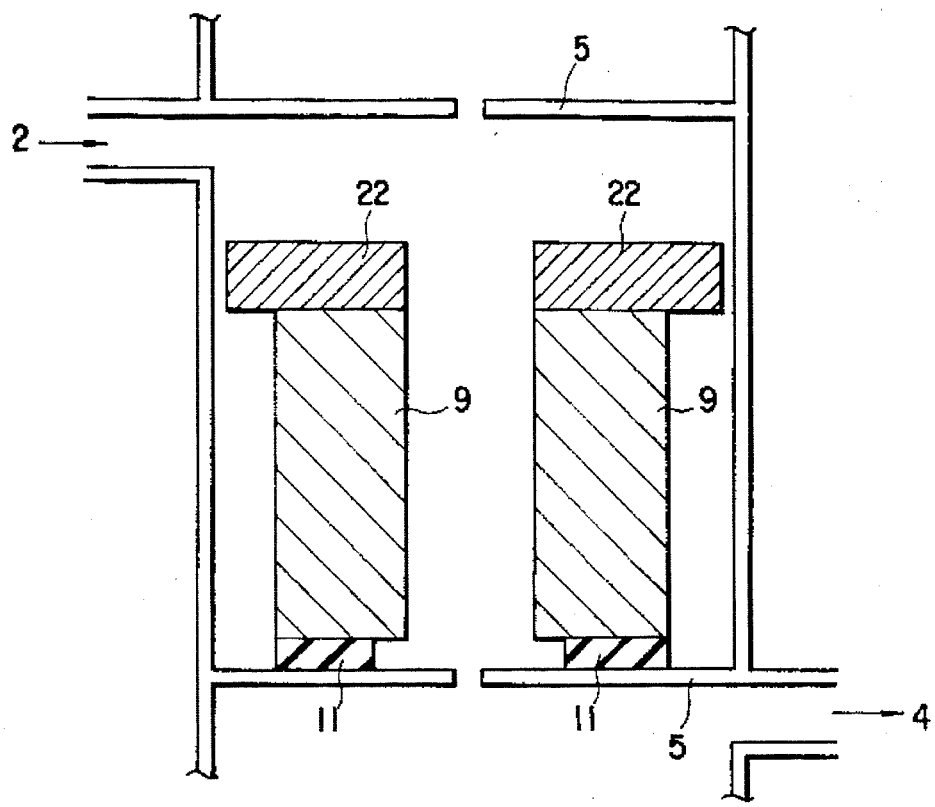
F I G. 14
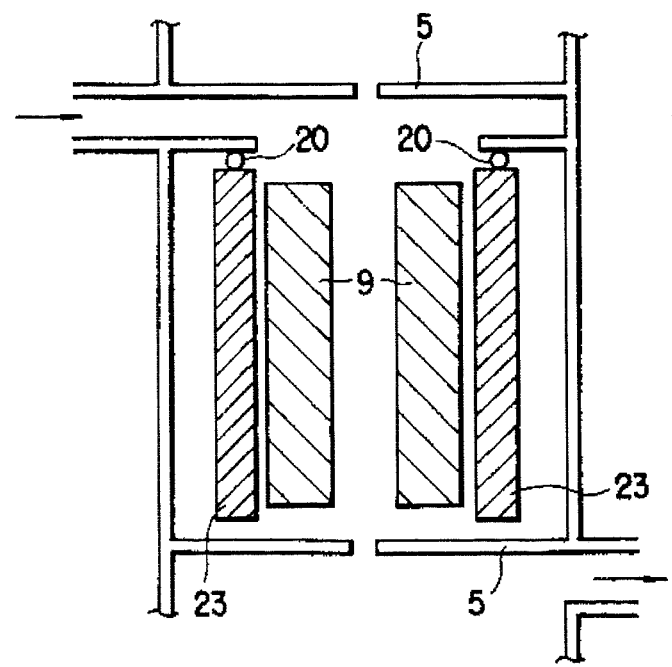
F I G. 15

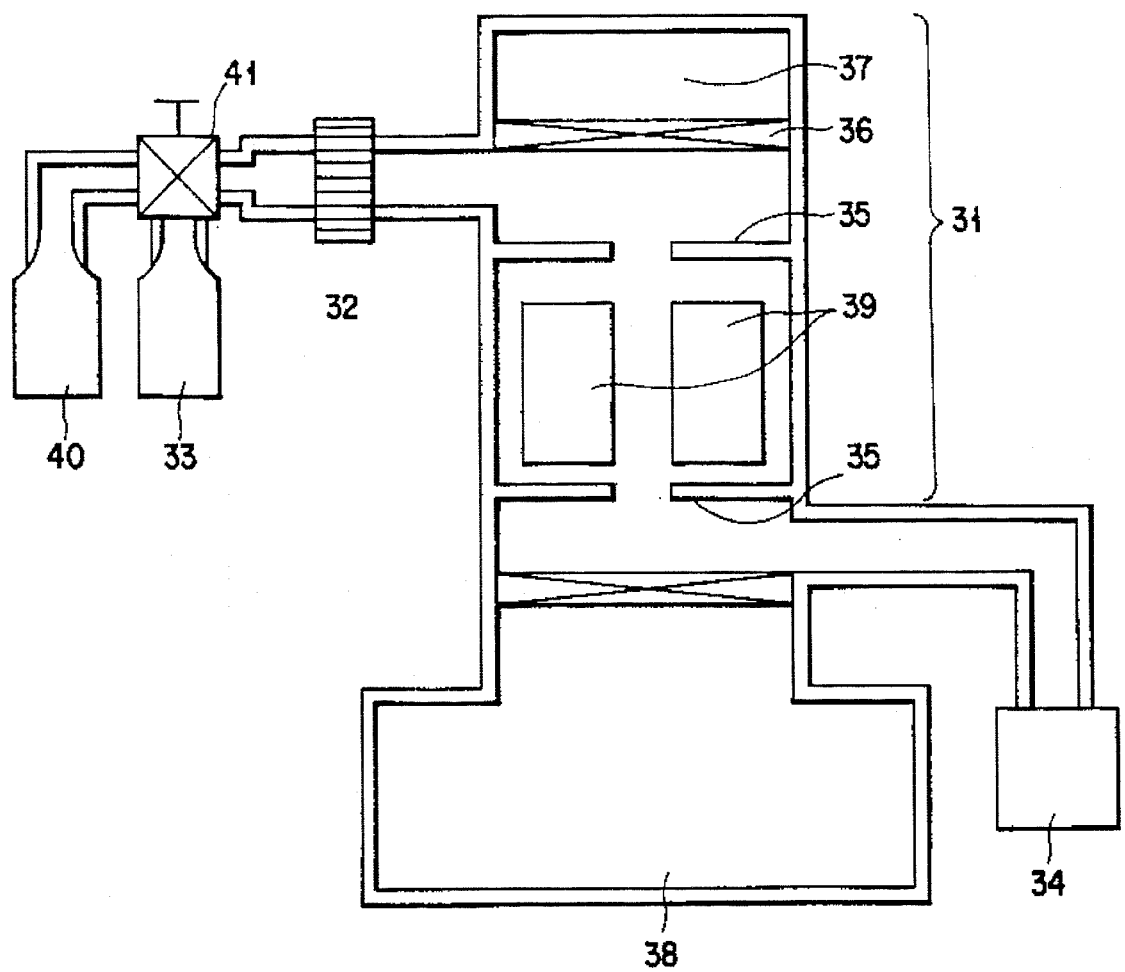
F I G. 16

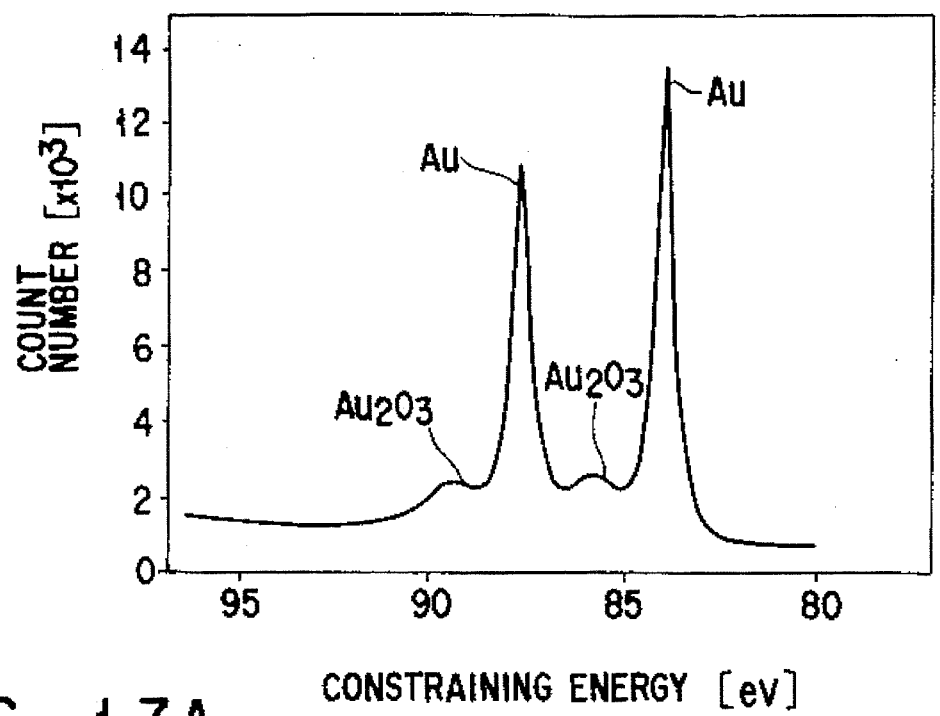
F I G. 17A
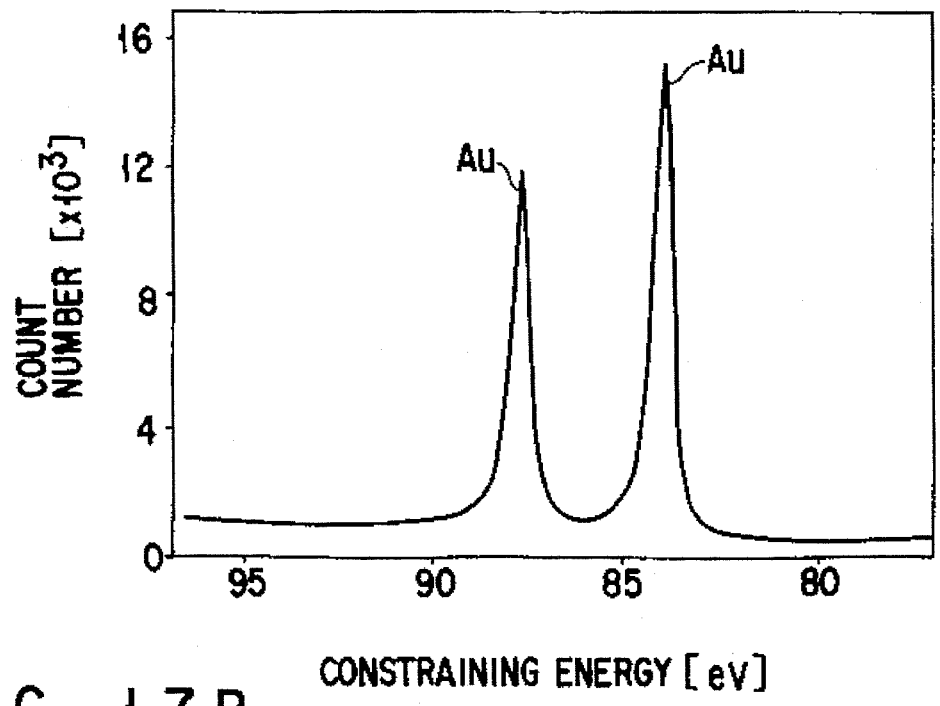
F I G. 17B

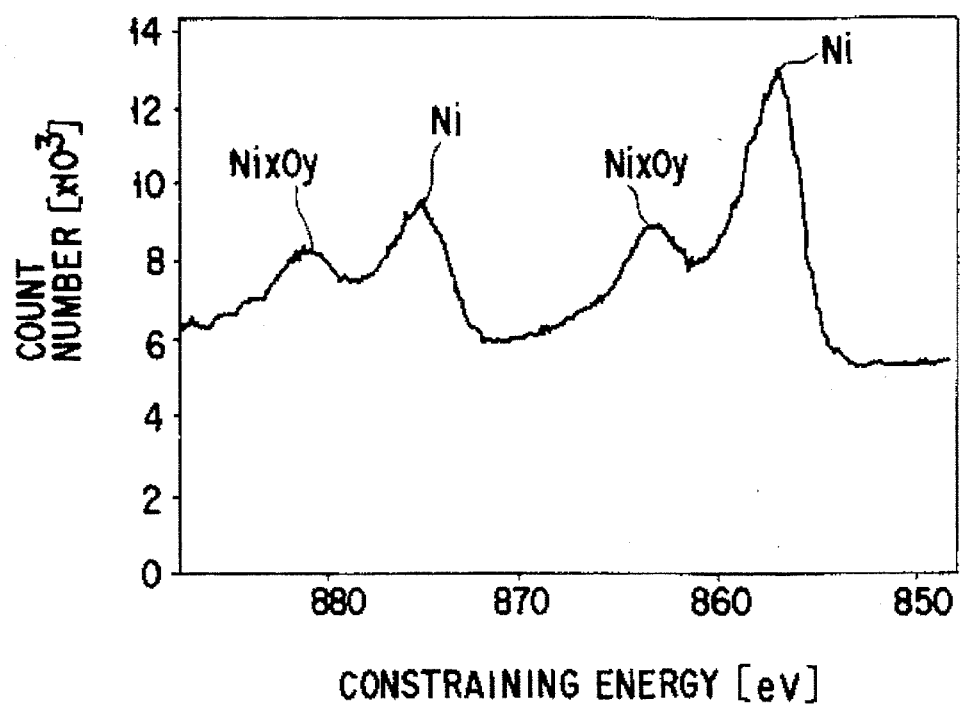
F I G. 18A
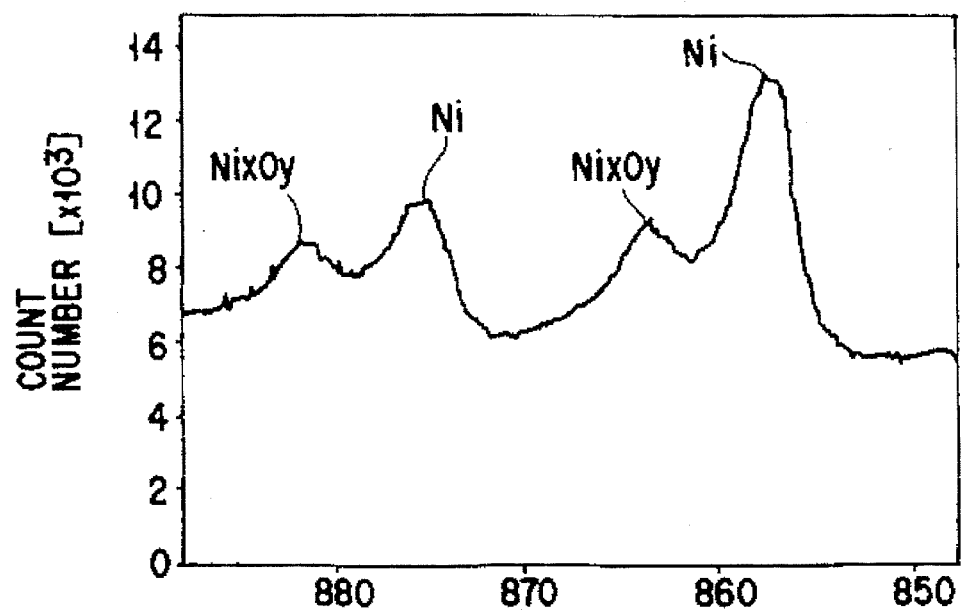
F I G. 18B

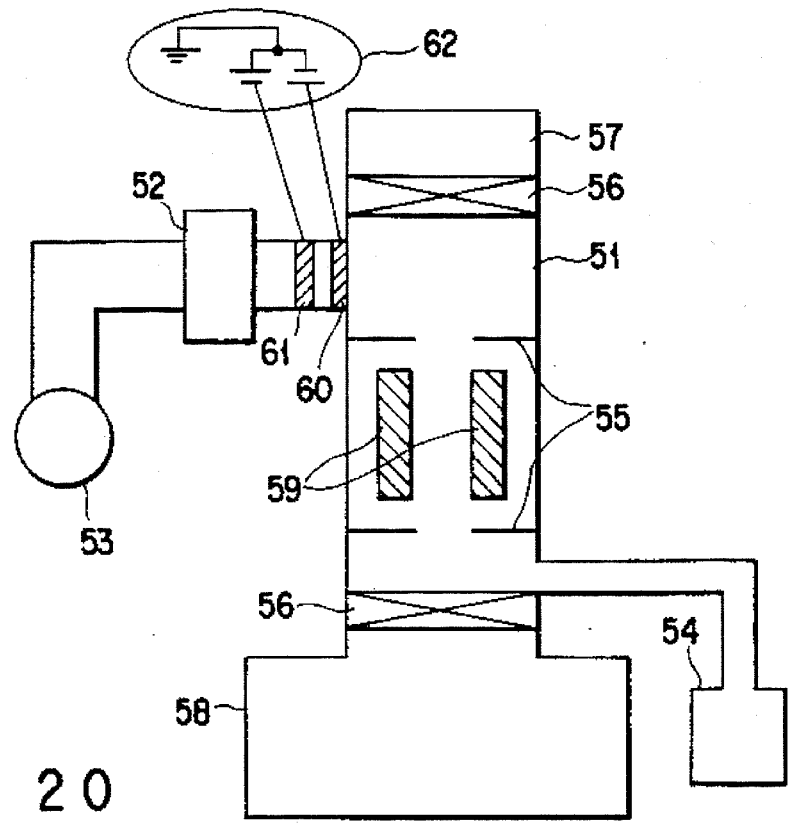
F I G. 20
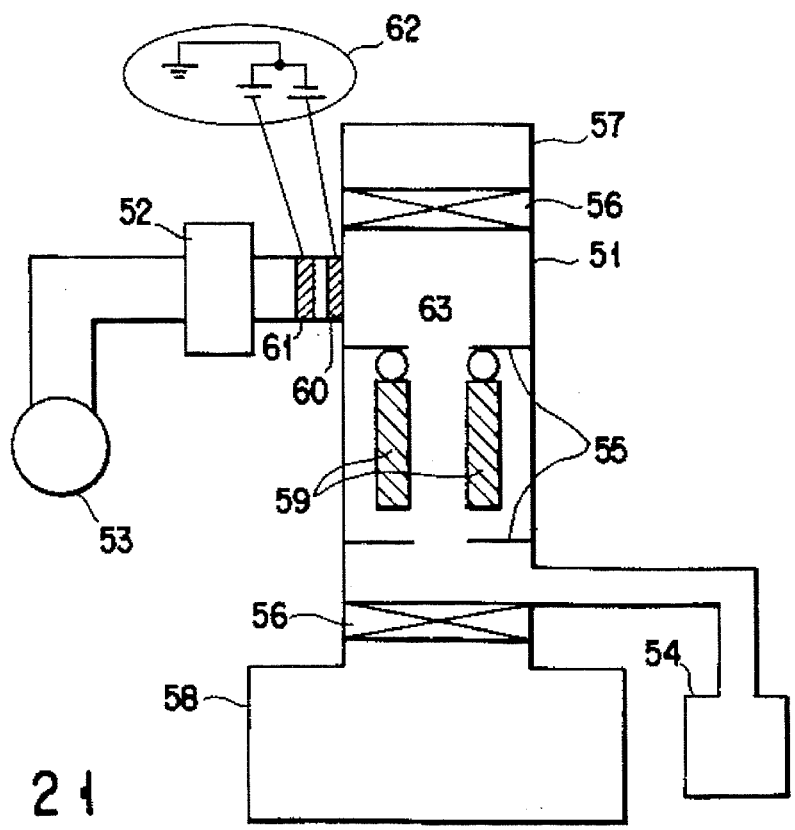
F I G. 21

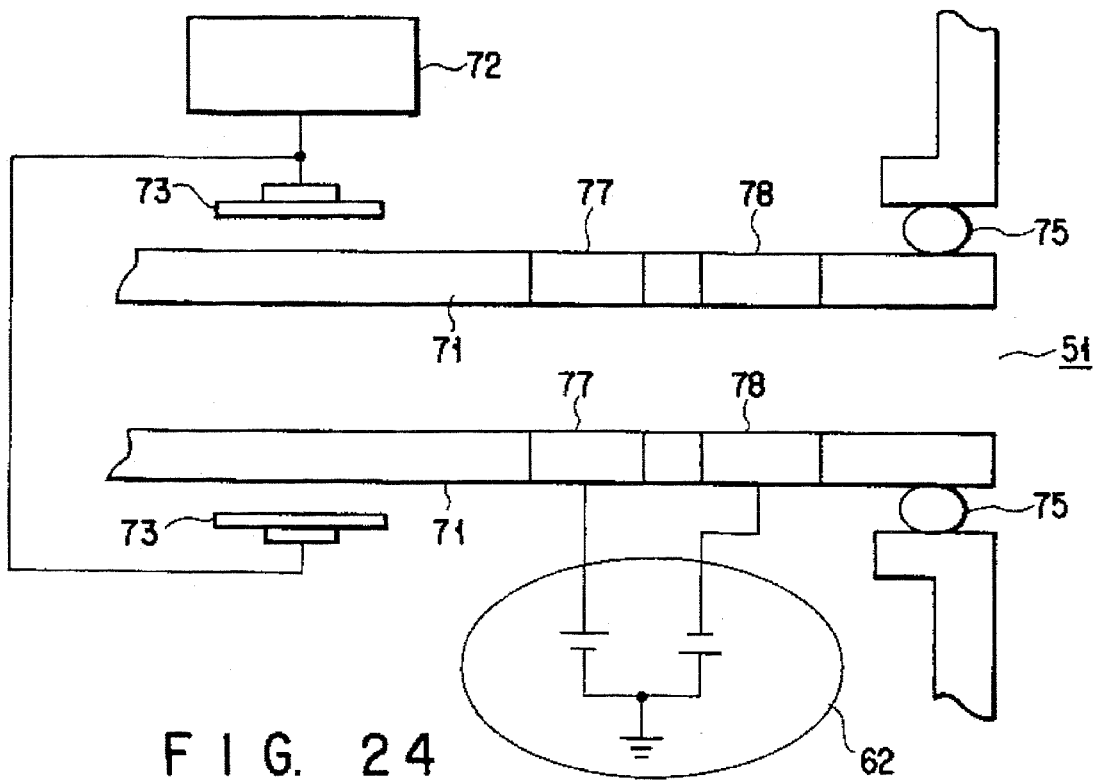
F I G. 24
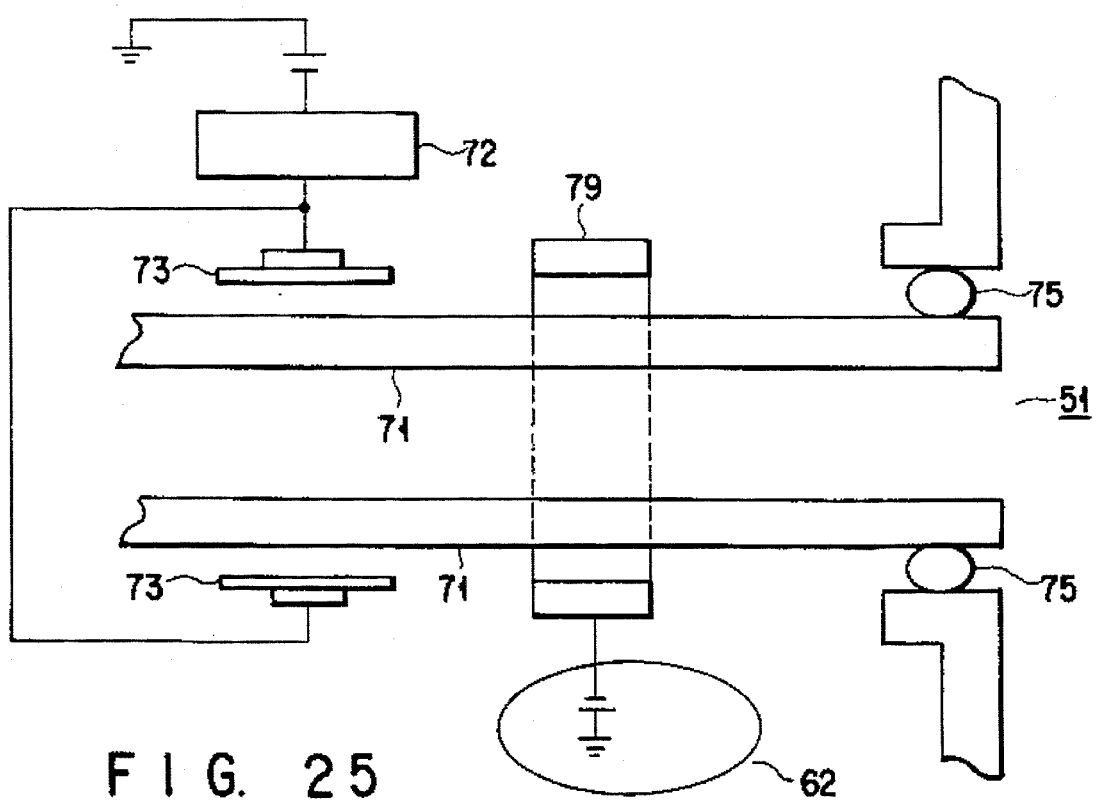
F I G. 25

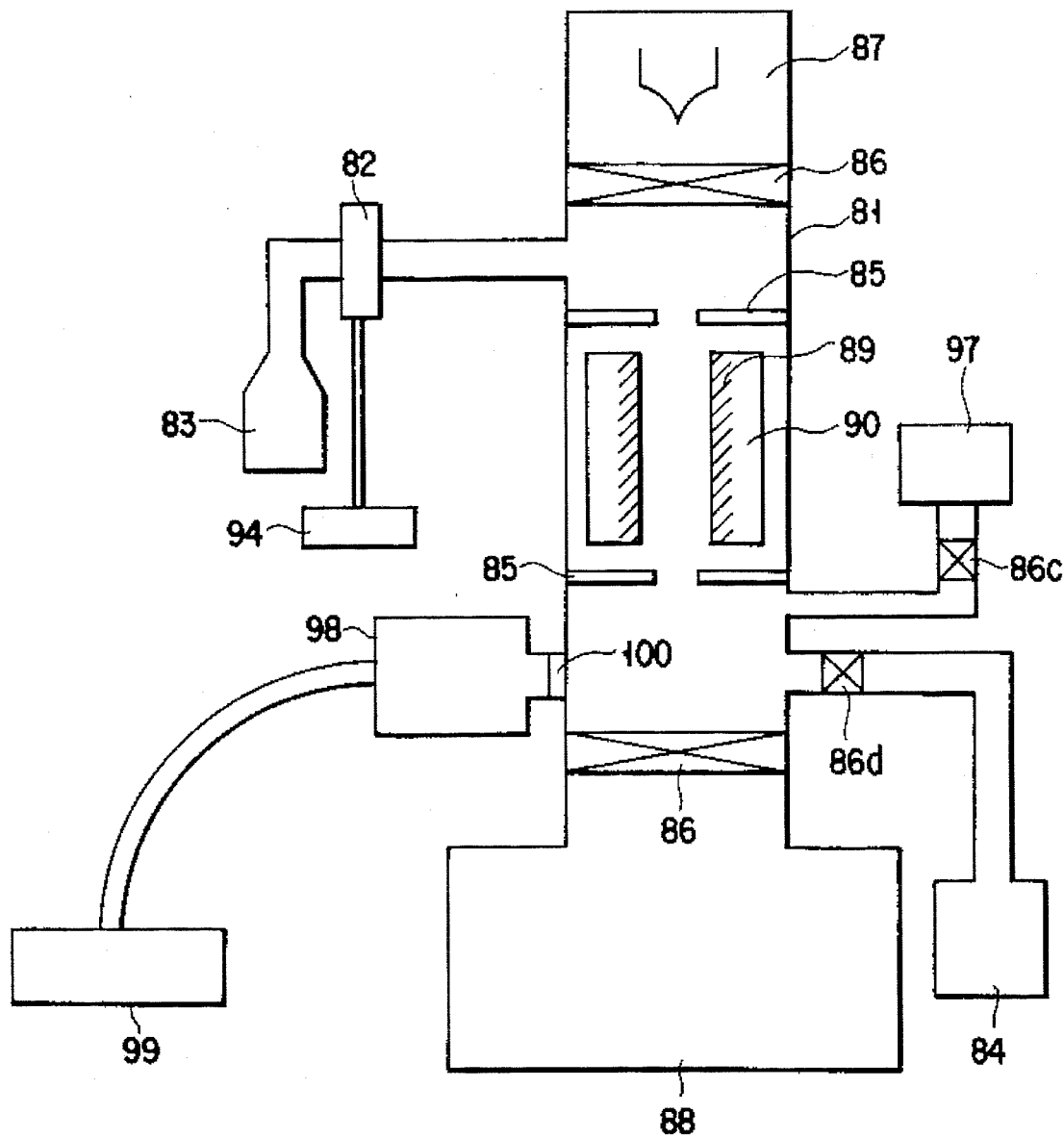
F I G. 28

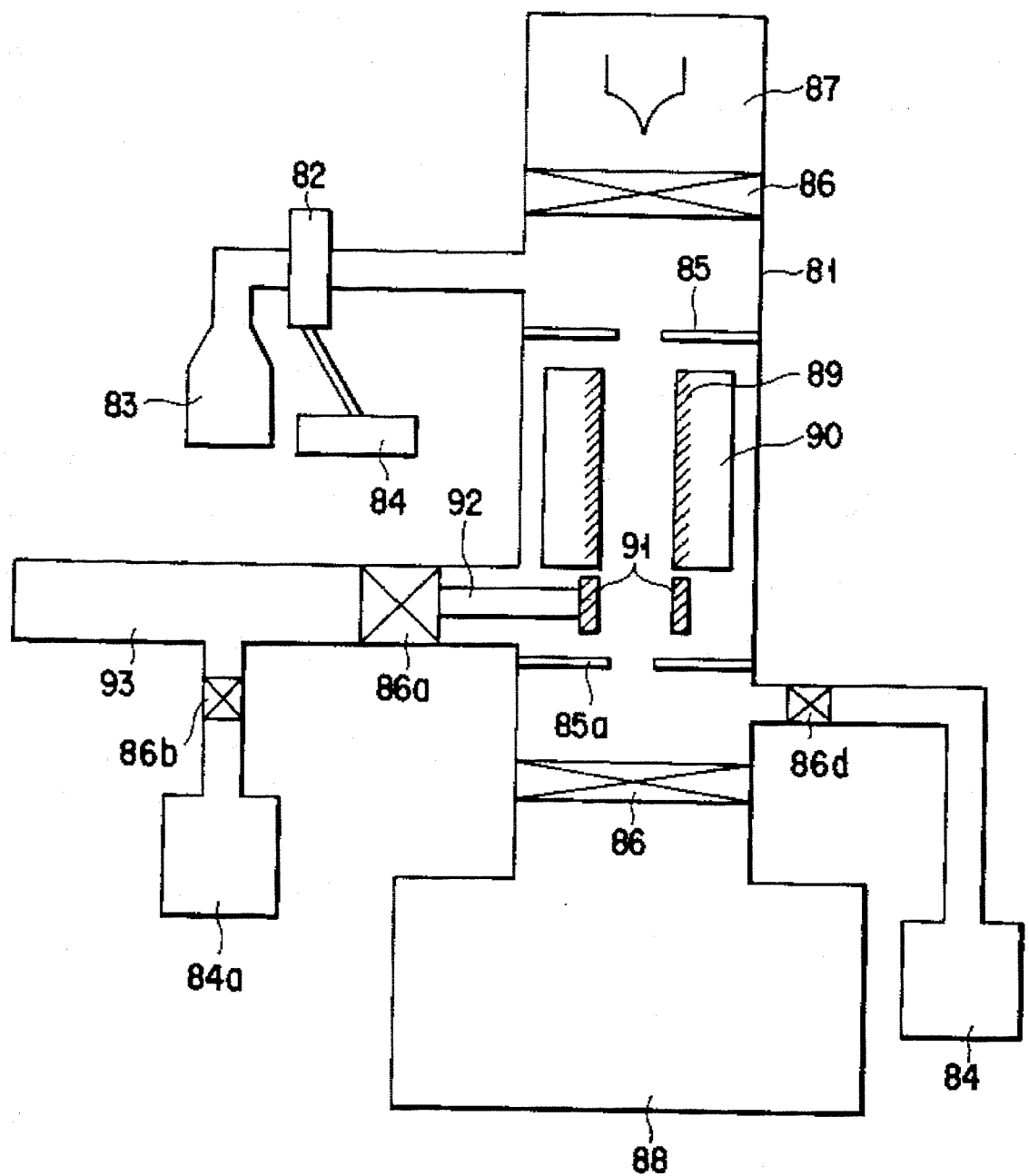
F I G. 32

CHARGED BEAM APPARATUS HAVING CLEANING FUNCTION AND METHOD OF CLEANING CHARGED BEAM APPARATUS

BACKGROUND OF THE INVENTION

1. Field of the Invention

The present invention relates to a charged beam apparatus using charged particles such as electrons and ions and a method of cleaning the apparatus, and particularly relates to a charged beam apparatus having a function of cleaning and a method of cleaning the apparatus.

2. Description of the Related Art

In recent years, as the density in integration of an integrated circuit has been improved, limitations have been pointed out with respect to photo-lithography which has been used as the leading technique for forming a fine pattern, while lithography using an electron beam (e.g., an electron beam exposure apparatus) has rapidly developed as a method for overcoming the limitations. In an electron beam exposure apparatus, contaminants stick to electrodes used for deflection or blanking, due to a reaction between scattering electrons or secondary electrons and residual gases, and the contaminants are charged during exposure so that the contaminants serve as factors which change the trajectory of the electron beam. Therefore, it has been necessary to clean electrodes, apertures, and the likes to remove contaminants. As means for solving these problems, an in-situ cleaning method using plasma is well-known (Jpn. Pat. Appln. KOKAI Publication No. 1-22978). The plasma means a state in which respective particles are dissociated into ions and electrons and the entire gas system is substantially electric neutral.

That is, as shown in FIG. 1, a mixture of an $O_2$ gas and a $CF_4$ gas is supplied to a plasma generator apparatus 172 provided outside the column 171 of an electron beam exposure apparatus, and plasma generated by microwave-exciting the gas mixture is drawn into the column 171 and is made to flow into two apertures 175, i.e., upper and lower apertures in the column 171, while being exhausted by a rotary pump 174. As a result of this, contaminants of hydrocarbon base sticking to metallic members, such as apertures 175 and a deflection electrode 179 for controlling movements of electrons and the likes, react with ions having a strong oxidizing power and are evaporated, thus removing them from metallic members such as apertures 175, a deflection electrode 179 and the likes. In this figure, reference 176 denotes a gate valve, reference 178 denotes an electron beam generator portion, and reference 178 denotes an exposure chamber. Further, the deflection electrode 179 is retained at a predetermined position by a measure not shown.

However, the cleaning method using plasma as stated above include the following problems. Specifically, ions in plasma used for removing contaminants have a function of fluorinating and oxidizing metal members such as a deflection electrode, thereby forming an oxide film, a fluoride film, and the likes on surfaces of metal members, in addition to a function of removing contaminants, i.e., substances of hydrocarbon base. Since these oxidizing and fluoridating films are insulating materials, these films are slightly charged by scattering electrons and secondary electrons during exposure. Even such slight charging serves as a factor which makes an electron beam drift, and the drifting makes it difficult to form a highly precise pattern. Further, a rapid increase in temperature due to ion-sputtering makes bad influences such as damages the metal members or the mechanical accuracy thereof.

To solve these problems, a method of providing a grid above a cleaning portion thereby to repulse ions and the likes in plasma which serve as factors causing an oxidized film or a fluoride film (Jpn. Pat. Appln. KOKAI Application No. 3-3225). However, in this method, although remarkable changes of color due to oxidization can be avoided, an oxidized film and a fluoride film are still formed so that sufficient cleaning effects cannot be obtained.

In addition, as another method for solving the problems, there is provided a method of removing an oxidized film and a fluoridated film by heating a cleaning portion after cleaning with use of active species having a lower oxidizing power than plasma ions (Jpn. Pat. Appln. KOKAI Publication 5-144716). Further, in this method, it is possible to avoid damages on materials due to sputtering. The active species mean molecules each being electrically neutral, i.e., excited molecules and radicals. A radical is a molecule having unpaired electrons, e.g., an O atom. However, there is a problem that oxidized materials formed on a part made of iron cannot be removed by heating, depending on members of cleaning portions. Further, there is a problem that the active species have an oxidizing power smaller than ions and are easily lost, so that, in a location far from the source of the active species, cleaning abilities are lost and sufficient cleaning cannot be performed.

In addition, since the internal space of the column 171 is divided into a plurality of independent areas by partitions having a small exhausting conductance such as apertures 175, there is a problem that the cleaning ability is lost when plasma or active species pass through a partition or randomly pass through inside the column. Such lowering of the cleaning ability appears noticeable in case of using the method disclosed in Jpn. Pat. Appln. KOKAI Publication No. 5-144716, as the cleaning method using the active species. Further, when the power of generating plasma is increased to avoid lowering of the cleaning ability, as disclosed in Jpn. Pat. Appln. KOKOKU Publication No. 1-22978, oxidization or fluorination of the surface near the generating portion is intensified.

Further, in the method of removing an oxidized film and a fluoride film by heating the above-mentioned cleaning portion, an apparatus for performing heating is required in addition to an electron beam exposure apparatus, so that there is a problem that the size of the entire apparatus is enlarged and costs are increased. In addition, heating of cleaning portions such as a column and the likes are factors causing degradation in mechanical accuracy.

Furthermore, although active species are generated by using plasma, not only active species but also charged particles such as ions in plasma are introduced into the apparatus in the Jpn. Pat. Appln. KOKAI Publication No. 5-144716 so that charging particles collide with the column, thereby rapidly increasing the temperature of the cleaning portion, since any particular means is not provided for selectively introducing active species. This increase in temperature due to ion collision is a serious problem in case of the method disclosed in Jpn. Pat. Appln. KOKAI Publication 3-3225. Very fine control of time, powers, and the likes are required when cleaning is performed. In addition, the above apparatus (which uses a gas such as plasma to remove contaminants) does not comprises measurement means for measuring the percentage with which removal of contaminants is achieved, and whether or not appropriate processing has been performed cannot be confirmed until the apparatus is actually commenced. In addition, there is a problem that if removal of contaminants is insufficient, cleaning is performed again so that time for vacuum exhaustion is wasted and operation rate decreases.

Further, although it has been proposed a method of irradiating a charged beam and estimating the extent of procedure of cleaning on the basis of a change in the current thereby to measure cleaning effects (Jpn. Pat. Appln. KOKAI 63-313458), it is considered difficult to apply this method to a cleaning method using a gas such as plasma. This is because a high vacuum (of approximately $10^{-5}$ Torr) is required to irradiate a charged beam while cleaning with use of a gas such as plasma is carried out under low atmospheric pressure (of approximately 0.1 Torr).

Meanwhile, since means for generating a cleaning gas and means for exhausting a cleaning gas are formed to be integral with a column in a conventional charged beam apparatus (Jpn. Pat. Appln. KOKAI Publication No. 1-22978), there is a problem that the charged beam apparatus itself is influenced by the generating and exhausting means. For example, there is a problem that an oscillation is generated in the apparatus itself by the above generating means and the exhausting means, thereby lowering drawing precision, and exhaustion in the column cannot be smoothly performed.

Further, the following problem occurs in case of using a plurality of charged beam apparatuses each having a cleaning function are used. That is, costs for the entire apparatus increase since the generating means and the exhausting means are required for each charged beam apparatus.

As has been explained above, cleaning is performed by removing contaminants with use of plasma or active species, in a conventional electron beam exposure apparatus.

However, when the internal space of the column is divided into a plurality of independent areas, and when a gas is made flow randomly in the column, there is a problem that cleaning abilities of plasma and active species, and in particular, the cleaning ability of the active species is greatly decreased (a first problem).

In addition, there is a problem that the plasma forms an oxide film or a fluoride film which causes drifting. Therefore, a method has been proposed in which cleaning portions are heated after cleaning is performed with use of active species having a smaller oxidation force than plasma (ions), cleaning portions are heated thereby to remove an oxide film and a fluoride film.

However, in this method, since an apparatus for performing heating is required, there is a problem that the size of the entire apparatus and costs thereof are increased. In addition, cleaning portions of the column and the likes are heated to a high temperature, and mechanical accuracy is lowered. Even when the column is allowed to be heated, the oxide film formed or Ni, Fe, Cu etc cannot be removed by heating. (a second problem).

Further, another problem is that, although active species are generated with use of plasma, since a conventional apparatus does not particularly comprise means for selectively introducing active species, not only active species but also ions in plasma are introduced into the apparatus so that charged particles collide with cleaning portions of the column, thereby rapidly increasing the temperature of the cleaning portions, and that the mechanical accuracy is lowered and the advantage obtained by using active species for a cleaning is lost (a third problem).

In addition, since means for measuring the degree of accomplishment of removing internal contaminants is not comprised, whether or not appropriate processing has been carried out is not confirmed before actual drawing is performed. Furthermore, if removal of contaminants is insufficient, cleaning is performed again so that time required for vacuum exhausting is wasted, and the operation rate is lowered (a fourth problem).

Further, since the means for generating a cleaning gas and the means for exhausting a cleaning gas are formed to be integral with the column, the charged beam apparatus itself is badly influenced by the exhausting means during normal operation. In addition, when these kinds of apparatuses are used, costs are increased (a fifth problem).

SUMMARY OF THE INVENTION

The present invention has been made in view of the above situation, and has an object of providing a charged beam apparatus having a cleaning function by which the above first and second problems can be solved, and a method of cleaning the charged beam apparatus by which the above first and second problems can be solved.

To solve the first problem explained above, a charged beam apparatus having a cleaning function according to the present invention is characterized by comprising: a column including a charged beam generating portion and an optical system for controlling and/or deflecting a charged beam; a chamber provided to be connected to the column and containing a member to be irradiated by the charged beam; first separating means for separating the charged beam generating portion and the optical system with respect to vacuum condition; exhausting means for performing exhaustion of a portion partitioned by the first separation means; gas generating means connected to the separated portion, for generating an internal contaminant removal gas formed of at least one of plasma and an active species which are supplied to remove internal contaminants from the partitioned portion; and passage control means for controlling a passage of the internal contaminant removal gas such that the internal contaminant removal gas passes through a predetermined cleaning portion, without fail after the internal contaminant removal gas generated by the gas generating means is introduced into the partitioned portion from the gas generating means and before the gas is exhausted by the exhausting means.

To solve the first problem stated above, another charged beam apparatus having a cleaning function according to the present invention is characterized in that the predetermined cleaning portion is regions through which the charged beam passes and with which scattering electrons caused by the charged beam collide.

To solve the first problem stated above, another charged beam apparatus having a cleaning function according to the present invention is characterized in that the partitioned portion is divided by a partition having a small exhausting conductance into small divisional portions and that the gas generating means or both the gas generating means and the exhausting means are provided for each of small divisional portions.

To solve the first problem stated above, another charged beam apparatus having a cleaning function according to the present invention is characterized in that all or a part of surfaces including at-least regions where the charged beam passes and where scattering electrons caused by the charged beam is formed of gold, platinum, palladium, or an alloy thereof, and that heating means is provided along the passage of the internal contaminant removal gas in the partitioned portion.

To solve the first problem stated above, another charged beam apparatus having a cleaning function according to the present invention is characterized by comprising: a column including a charged beam generating portion and an optical system for controlling deflection of a charged beam; a chamber provided to be connected to the column and containing a member to be irradiated by the charged beam; first separating means for separating the charged beam generating portion and the optical system by means of a vacuum; exhausting means for performing exhaustion of a portion partitioned by the first separation means; gas generating means connected to the separated portion, for generating an internal contaminant removal gas formed of at least one of plasma and an active species which are supplied to remove internal contaminants from the partitioned portion; a nozzle for introducing the internal contaminant removal gas from the discharging means, the nozzle being inserted in the column and a part or all of the nozzle being formed of insulating material; and a movable shutter provided between the nozzle and the internal contaminant removal gas, at least a surface thereof being formed of conductive material.

To solve the second problem stated above, a charged beam apparatus having a cleaning function according to the present invention is characterized by comprising: a column including a charged beam generating portion and an optical system for controlling deflection of a charged beam; a chamber provided to be connected to the column and containing a member to be irradiated by the charged beam; first separating means for separating the charged beam generating portion and the optical system by means of a vacuum; exhausting means for performing exhaustion of a portion partitioned by the first separation means; and gas generating means connected to the separated portion, for generating a first internal contaminant removal gas formed of at least one of first plasma and a first active species which are supplied to remove internal contaminants from the partitioned portion, and for generating a second internal contaminant removal gas formed of at least one of second plasma and a second active species which are supplied to remove internal contaminants formed in the partitioned portion due to supply of the first internal contaminant removal gas.

To solve the second problem stated above, a charged beam apparatus having a cleaning function according to the present invention is characterized by comprising flow passage control means for controlling a passage of the first and second internal contaminant removal gases such that the first and second internal contaminant removal gases pass through a predetermined cleaning portion, without fail after the first and second internal contaminant removal gases generated by the gas generating means are introduced into the partitioned portion from the gas generating means and before the gases are exhausted by the exhausting means.

To solve the second problem, a charged beam apparatus having a cleaning function according to the present invention is characterized in that surfaces of at least the predetermined cleaning portion of areas through which the internal contaminant removal gas passes is formed of gold, platinum, palladium, or an alloy thereof, and that a source gas which serves as the second internal contaminant removal gas is $H_2O$, $H_2$, a rare gas, or a gas mixture thereof.

To solve the third problem, a charged beam apparatus having a cleaning function according to the present invention is characterized by comprising: a column including a charged beam generating portion and an optical system for controlling deflection of a charged beam; a chamber provided to be connected to the column and containing a member to be irradiated by the charged beam; first separating means for separating the charged beam generating portion and the optical system by means of a vacuum; active species generating means provided outside the column so as to be connected to the partitioned portion, for subjecting an active species source gas to plasma-discharging and for generating an active species supplied to remove internal contaminants in the partitioned portion; and activating means introducing means for generating an electrostatic field and for selectively introducing only the active species.

To solve the fourth problem, a charged beam apparatus having a cleaning function according to the present invention is characterized by comprising: a column consisting of a charged beam generating portion and an optical system for controlling deflection of a charged beam; a chamber provided to be connected to the column and containing a member to be irradiated by the charged beam; first separating means for separating the charged beam generating portion and the optical system by means of a vacuum; exhausting means for performing exhaustion of a portion partitioned by the first separation means; gas generating means connected to the separated portion, for generating an internal contaminant removal gas formed of at least one of plasma and an active species which are supplied to remove internal contaminants from the partitioned portion; and monitoring means for monitoring a degree of accomplishment of the internal contaminants.

To solve the fourth embodiment stated above, a charged beam apparatus having a cleaning function according to the present invention is characterized in that the monitoring means is provided at a lower position in a down-stream direction of the passage for the internal contaminant removal gas than the cleaning portion to be cleaned by the internal contaminant removal gas.

To solve the fourth embodiment stated above, a charged beam apparatus having a cleaning function according to the present invention is characterized in that the monitoring means comprises a sample for measuring a degree of accomplishment of removal of the internal contaminants, and means for moving the sample into and out of the body tube or the chamber while maintaining the vacuum in the column and the chamber.

To solve the fourth embodiment stated above, a charged beam apparatus having a cleaning function according to the present invention is characterized in that the monitoring means comprises measurement means for measuring an amount of at least an active species in the column or the exposure chamber, plasma, a reactant obtained between the internal contaminants and the activating seed, and a reactant obtained between the internal contaminants and the plasma.

To solve the fifth problem of the present invention, the charged beam apparatus having a cleaning function is characterized by comprising: a column including a charged beam generating portion and an optical system for controlling deflection of a charged beam; a chamber provided to be connected to the column and containing a member to be irradiated by the charged beam; first separating means for separating the charged beam generating portion and the optical system by means of a vacuum; exhausting means for performing exhaustion of a portion partitioned by the first separation means, the exhausting means having at least a portion which is provided outside the column; gas generating means connected to the separated portion, for generating an internal contaminant removal gas formed of at least one of plasma and an active species which are supplied to remove internal contaminants from the partitioned portion.

In addition, another charged beam apparatus according to the present invention is characterized by comprising second separation means for separating the optical system from the exposure chamber by means of a vacuum.

Further, to solve the first problem stated above, a method of cleaning a charged beam apparatus according to the present invention is characterized by comprising steps of: supplying a cleaning gas from cleaning gas supply means to a column including a charged beam generating portion and an optical system for controlling deflection; exciting the supplied cleaning gas by using gas generation means, generating an internal contaminant cleaning gas consisting of at least one of plasma and an active species, and introducing the internal contaminant cleaning gas into the column; controlling a flow passage such that the introduced internal contaminant cleaning gas passes through a predetermined cleaning portion in the body tube, and other portions in the column are shielded air-tightly; cleaning internal contaminants sticking to the predetermined cleaning portion in the column with use of the internal contaminant cleaning gas; and exhausting the internal contaminant cleaning gas and the internal contaminants to the outside of the apparatus through exhausting means after cleaning.

A method of cleaning a charged beam apparatus according to the present invention is characterized in that the predetermined cleaning portion is a region where the electron beam passes and a region to which scattering electrons caused by the charged beam collide.

In addition, to solve the second problem stated above, a method of cleaning a charged beam apparatus according to the present invention is characterized by comprising steps of: supplying a first cleaning gas of pre-cleaning from first cleaning gas supply means to a column including a charging beam generating portion and an optical system for controlling deflection; exciting the supplied first cleaning gas by using gas generation means, generating a first internal contaminant cleaning gas consisting of at least one of plasma and an active species, and introducing the internal contaminant cleaning gas into the column; pre-cleaning internal contaminants sticking to a predetermined cleaning portion in the column with use of the introduced first internal contaminant cleaning gas; exhausting the first internal contaminant cleaning gas and the internal contaminants through exhausting means to outside of an apparatus after the pre-cleaning; supplying a second cleaning gas for after-cleaning from second cleaning gas supply means to the column; exciting the supplied second cleaning gas with use of gas generation means, generating a second internal contaminant cleaning gas consisting of at least one of plasma and an active species, and introducing the internal contaminant cleaning gas into the body tube; after-cleaning the internal contaminants sticking to the predetermined cleaning portion in the column with use of the introduced second internal contaminant cleaning gas; and exhausting the second internal contaminant cleaning gas and the internal contaminants through the exhausting means to outside of an apparatus after the after-cleaning.

According to the charged beam apparatus of the present invention, flow passage control means is provided, a flow of a gas can be controlled by the means, and deterioration in cleaning ability of plasma and an active species can be prevented, so that cleaning can efficiently be carried out. As a result of this, the power used for discharging can be reduced to ¹/₁₀ of the power in Jpn. Pat. Appln. KOKAI Publication No, 1-229778, and cleaning can be performed with a simple structure. In addition, unnecessary oxidation or fluoridation can be prevented if an electron beam is arranged so as not to pass through cleaning surfaces of a partitioned portion to be cleaned.

According to the charged beam apparatus of the present invention, the partitioned portion is divided into a plurality of independent regions by a partition having a small conductance, and an internal contaminant removal gas consisting of at least one of plasma and an active species is supplied for each region. Therefore, deactivation caused by passing of an internal contaminant removal gas can be prevented, so that cleaning ability of the internal contaminant removal gas can be restricted.

According to the charged beam apparatus having a cleaning function of the present invention, oxide material or fluoridated material generated at a low heating temperature during cleaning can be cleaned by heating means, by using appropriate material for a cleaning surface to be cleaned. Specifically, oxide material and the like formed during cleaning can be removed by heating a desired portion at a low temperature after cleaning, and a soiled surface can be completely recovered. In this manner, drifting reduced by cleaning can further be reduced. A heating portion and other portions can be thermally insulated so that no problem occurs. In addition, if a liquid is used as heating means, heating can be achieved during steady-state operation, so that the cleaning period can be extended and the drawing precision can be improved.

According to the charged beam apparatus, an active species and the like can be introduced through a nozzle, so that the cleaning ability can be prevented from being degraded and that internal contaminants can be effectively removed.

Further, in the present invention, a movable shutter formed of conductive material having at least a surface made of conductive material is provided between a nozzle and a charged beam. Therefore, if the internal surface of the nozzle is formed of insulating material, charging-up of a nozzle caused by charging particles existing in the charged beam can be prevented by moving the movable shutter such that the internal surface of the nozzle can be observed from a charged beam but that the charged beam cannot be observed from the internal surface of the nozzle.

According to the charged beam apparatus of the present invention, a gas, which generates a first internal contaminant removal gas consisting of first plasma or a first active species supplied to remove internal contaminants of a partitioned portion, and a second internal contaminant removal gas consisting of second plasma or a second active species supplied to remove internal contaminants formed in the partitioned portion by supplying the first internal contaminant removal gas, is used as a cleaning gas. Removal of internal contaminants can be performed more completely than in a conventional charged beam apparatus which uses a first internal contaminant removal gas, and the drawing precision can thereby be improved. In addition, since heating is not necessary for this method, anxiety about deterioration in mechanical precision is not required. Further, since a heating mechanism is not required, the structure of the apparatus is simplified.

Further, according to the charged beam apparatus having a cleaning function of the present invention, only an active species can be selectively introduced into the partitioned portion by active species introducing means, disadvantageous influences from charged particles such as ions and the likes can be eliminated.

In addition, according to the charged beam apparatus having a cleaning function of the present invention, determination as to an end of removal of internal contaminants can be performed accurately by monitoring means, so that deterioration in throughput caused by cleaning of the charged beam apparatus can be prevented.

The monitoring means is specifically installed in a column, a pipe for exhausting an internal contaminant removal gas, or the like. Conductive material forming at least the surface of a movable shutter is, for example, gold, platinum, or an alloy thereof.

In addition, according to the charged beam apparatus, at least a portion of the gas generating means is provided outside the column, and the portion provided outside the column is detachable from the column. Therefore, disadvantageous influences from the gas generating means can be eliminated by detaching the gas generating means from the column during normal operation. In this manner, the mechanical accuracy can be improved. In addition, if not only the gas generating means but also exhausting means are arranged to be detachable from the column, the mechanical accuracy can be further improved.

If one gas generating means is commonly occupied by a plurality of charged beam apparatuses each having a cleaning function, an increase in costs can be prevented. In this case, the purpose of reducing costs can be achieved as long as the number of gas generating means commonly occupied is smaller than the number of charged beam apparatuses each having a cleaning function. Further, if the gas generating means is detachable, an increase in costs can be prevented when not only the gas generating means but also the exhausting means are commonly occupied.

According to the method of cleaning a charged beam apparatus, cleaning is performed such that an internal contaminant removal gas passes through a predetermined region (i.e., a region through which a charged beam passes and a region with which scattering electrons caused by a charged beam collide). Therefore, cleaning can efficiently be performed.

According to the method of cleaning a charged beam apparatus, since the active species and the like are introduced into the sectionalized portion bit using the nozzle, lowering of the cleaning ability of the active species and the like can be prevented, and the internal contaminant can be removed effectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a view schematically showing the structure of the electron beam exposure apparatus having a cleaning function, according to the first embodiment;

FIG. 8 is a view explaining a method for estimating changes in trajectory caused by contaminants;

FIG. 14 is a view showing means for restricting passages of plasma;

FIG. 15 is a view showing another means for restricting passages of plasma;

FIG. 16 is a view showing the schematic structure of an electron beam exposure apparatus according to a fourth embodiment of the present invention;

FIGS. 17A and 17B are graphs showing results of XPS measurements where a metal member is cleaned with an $H_2O$ gas;

FIGS. 18A and 18B are graphs showing results of XPS measurements where a nickel member is cleaned with an $H_2O$ gas;

FIG. 20 is a view schematically showing the structure of an electron exposure apparatus having a cleaning function according to the fifth embodiment of the present invention;

FIG. 21 is a view schematically showing the structure of an electron exposure apparatus having a cleaning function according to the sixth embodiment of the present invention;

FIG. 24 is a view showing a specific structure of another means for introducing active species;

FIG. 25 is a view showing a specific structure of another means for introducing active species;

FIG. 28 is a view showing a schematic structure of an electron beam exposure apparatus having a cleaning function provided with a mechanism for cleaning the inside of the column according to the ninth embodiment of the present invention;

FIG. 32 is a view showing a schematic structure of an electron beam exposure apparatus having a cleaning function provided with a mechanism for cleaning the inside of the column according to the thirteenth embodiment of the present invention;

DETAILED DESCRIPTION OF THE PREFERRED EMBODIMENTS

Figure 1:
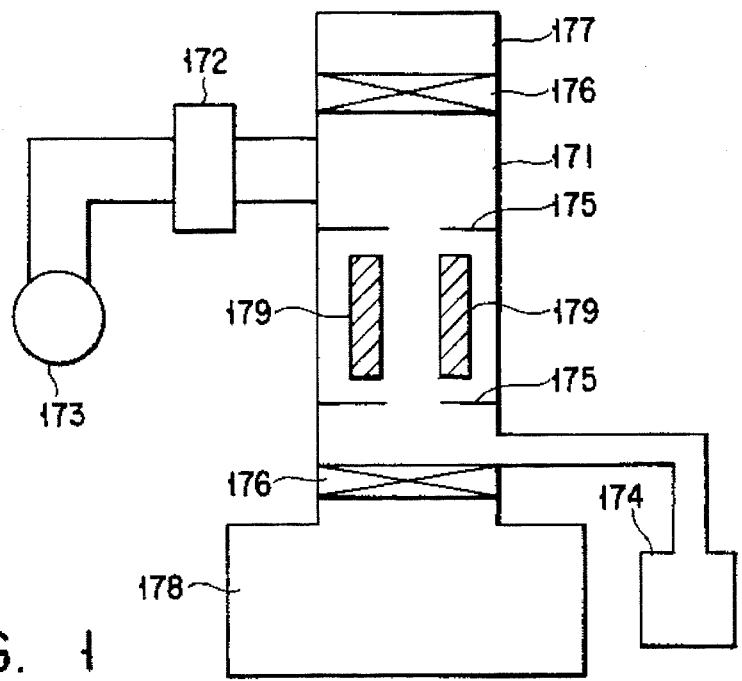
FIG. 1 is a schematic view showing a conventional electron beam exposure apparatus having a cleaning function.

Embodiments of the present invention will be explained with reference to the drawings hereinafter.

First Embodiment

FIG. 2 is a view showing a schematic structure of an electron beam exposure apparatus having a cleaning function provided with a mechanism for cleaning the inside of the column according to the first embodiment of the present invention. In FIG. 2, reference 1 denotes a column of an electron beam exposure apparatus, and this column 1 is roughly divided into a beam generating portion 7 which generates an electron beam and an optical system which deflects and controls the electron beams consisting of a deflection electrode and the likes. Gate valves 6 are provided above and below the column 1. By using these gate valves 6, the inside of the column 1 is separated into a beam generating portion 7 for generating an electron beam, an exposure chamber 8 for containing a sample, and the optical system stated above, with respect to vacuum condition. Further, while maintaining a large part of the inside of the column 1 being kept depressurized at a pressure of $10^{-7}$ Torr, plasma (active species) of $10^{-2}$ to several 10 Torr can be made flow, so that a time for recovering the depressurized pressure after cleaning can be greatly shortened. In addition, a plasma generating portion 2 is provided outside the column 1, and the plasma generating portion 2 microwave-excites a plasma source gas (e.g., a mixture of an $O_2$ gas and a $CF_4$ gas) supplied from a source tank 3, thereby generating plasma. Before entering into the column 1, plasma mainly consists of active species which are electrically neutral and chemically active.

In the first embodiment, explanation will be made to a case in which a tank containing a gas mixture is used as a source tank. However, different source tanks may be respectively used for source gases. For example, it is possible to adopt a structure which consists of a first source tank containing an $O_2$ gas and a second source tank containing a $CF_4$ gas and in which these source gases are mixed with each other and then supplied to a plasma generating portion 2.

The portions of the electron beam exposure apparatus having a cleaning function which should be cleaned are denoted by reference 9, and include specifically a deflection electrode and apertures which are most soiled by in interaction between electrons and residual gases in the column 1. The surface of this portion to be cleaned is made of gold, and thermally and electrically insulated from peripheral portions by an insulating member 11. Alumina is preferred as material of the insulating member 11. This is because alumina has a high dielectric constant and is superior in processability and has a high corrosion resistance to the active gas in the plasma. In addition, the cleaning portion 9 to be cleaned is provided with an electric conductive heater 10 for the purpose of heating. Further, a thermocouple 13 is provided at the cleaning portion 9 to be cleaned, and the temperature of the cleaning portion 9 to be cleaned is monitored by this thermocouple 13, so that feed back of the power source 12 is controlled at a predetermined temperature.

In addition, the inside of the column 1 is separated into two regions C1 and C2 (called cells hereinafter) with respect to vacuum condition. Specifically, four cleaning portions 9 are divided into two cells C1 and C2. Further, each of the cells C1 and C2 is provided with an introducing port and an exhausting port. The cells C1 and C2 are respectively provided with an introducing port for introducing plasma used for cleaning and an exhausting port used for exhausting. The introducing port is connected with a plasma generating apparatus provided outside the apparatus, and the exhausting port is connected with an exhausting pump 4 such as a dry pump, a rotary pump, or the like. The plasma generating apparatus 2 is arranged such that plasma source supplied from a source tank can be generated by means of such as microwave excitation. Further, of the cleaning portions 9 to be cleaned in the cells C1 and C2, an O-ring 20 is provided as flow-passage control means such that the cleaning gas is formed to pass through inevitably the cleaning portion 9 during when it is introduced and then exhausted. Gate valves 6a and 6b are provided at the introducing port, and gate valves 6c and 6d are provided at the exhausting port. It is therefore possible to independently clean the cells C1 and C2.

In the next, a method of cleaning the inside of an electron beam exposure apparatus having a cleaning function thus constructed will be explained below. At first, gate valves 6 are closed, and a gas of $O_2+CF_4$ is supplied to a plasma generating apparatus 2 from a source tank 3 with a gas being exhausted at a pressure of 0.5 Torr by an exhausting pump 4. Thereafter, plasma is generated by a microwave excitation at a frequency of 2.45 GHz and at a power of 100 W. Generation of plasma is kept for five minutes thereby to clean the cleaning portions 9 to be cleaned. In this state, in the first embodiment, since an O-ring is provided as means for controlling passages, the cleaning gas passes through only the cleaning portion. Namely, there is no gas which is ventilated so as to pass through those portions to which contaminants do not stick, that is, there is no gas which is exhausted without passing through the area highlighted by oblique lines. In the present invention, the O-ring is used a specific example of an "hermetic shielding member", and a SUS ring and a metal gasket may be used in addition to the O-ring. Further, although the inside of the column 1 is divided into two independent cells C1 and C2 by apertures 5 having a small exhausting conductance, an introducing port and an exhausting port are provided for each of cells C1 and C2, so that cleaning can be performed for each of cells C1 and C2. Therefore, there is no problem that the cleaning ability of plasma or active species decreases since the plasma of the active species passes through the orifice having the small exhausting conductance. Thereafter, for example, the gas is exhausted to have a pressure of $10^{-6}$ Torr or less, and simultaneously, cleaning portions are heated to a temperature of 120° C. The temperature is maintained at 120° C. for ten minutes. In this while, the releasing gas in the column 1 is exhausted by the exhausting pump 4. As a result of this, during cleaning, the surface of the cleaning portion 9 to be cleaned is made of gold, so that an oxide film formed on the surface of the cleaning portion 9 is released from the surface thereof and is exhausted to the outside of the column 1, thereby forming a clean surface.

In the following, explanation will be made where the cleaning portion 9 to be cleaned is an electrode (the surface of which is coated with gold). In this case, the electrode whose surface is coated is selected since the surface of the electrode in the column 1 is coated to prevent oxidization.

Figure 3:
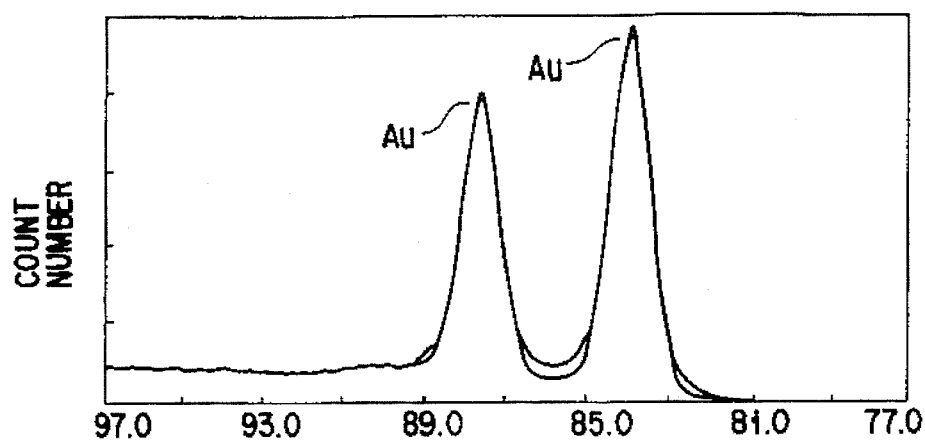
FIG. 3 is a graph showing results of XPS measurements on the surface of an electrode before cleaning with use of oxygen plasma.
Figure 4:
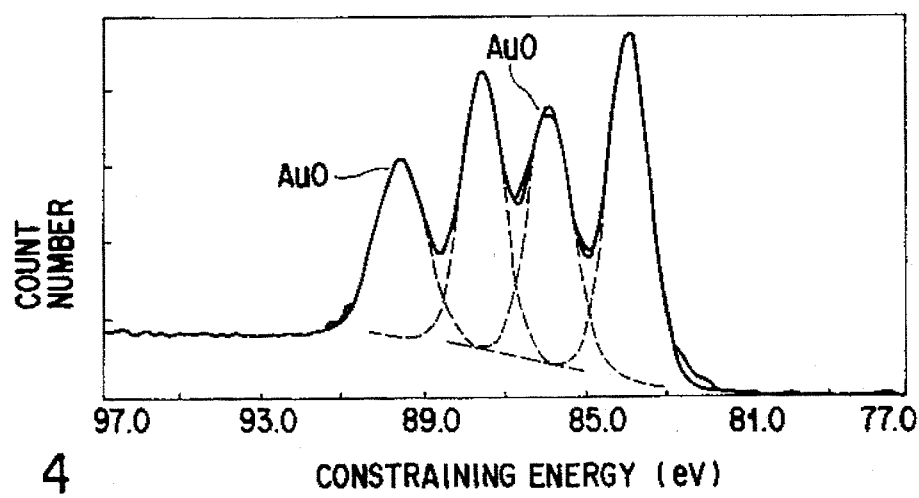
FIG. 4 is a graph showing results of XPS measurements on the surface of an electrode before cleaning with use of oxygen plasma.
Figure 5:
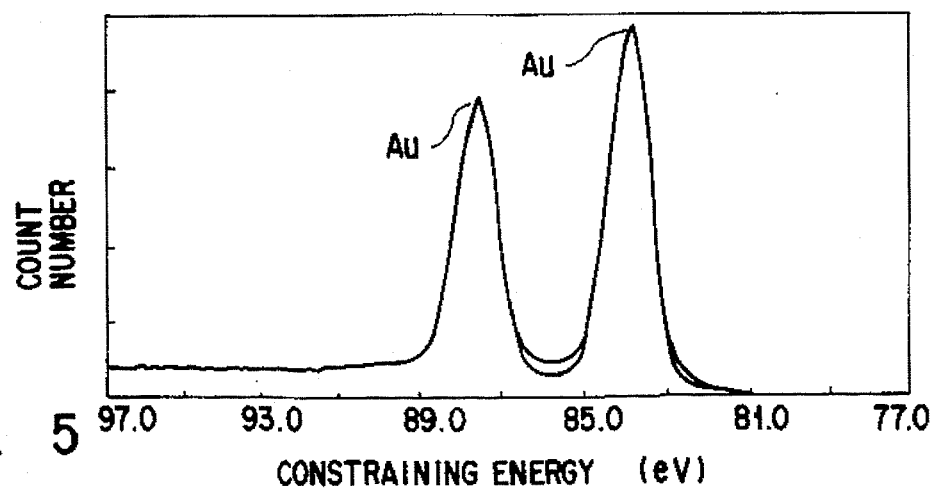
FIG. 5 is a graph showing results of XPS measurements on the surface of an electrode before cleaning with use of oxygen plasma.

FIGS. 3, 4, and 5 respectively show results of XPS (X-ray Photoelectron Spectroscopy) analysis before cleaning, after cleaning (without heating), and after cleaning (heating). Before cleaning, as is shown in FIG. 3, only the bond between gold and gold exists on the surface of an electrode. However, after cleaning (without heating), a peak shift caused by coupling between gold and oxygen is observed as shown in FIG. 4, and gold oxide is formed on the surface of an electrode. Therefore, if heating is performed at approximately 140° C. for five minutes as in this embodiment, a peak shift caused by coupling between gold and oxygen ceases and the situation returns to an original situation (before cleaning).

Figure 6:
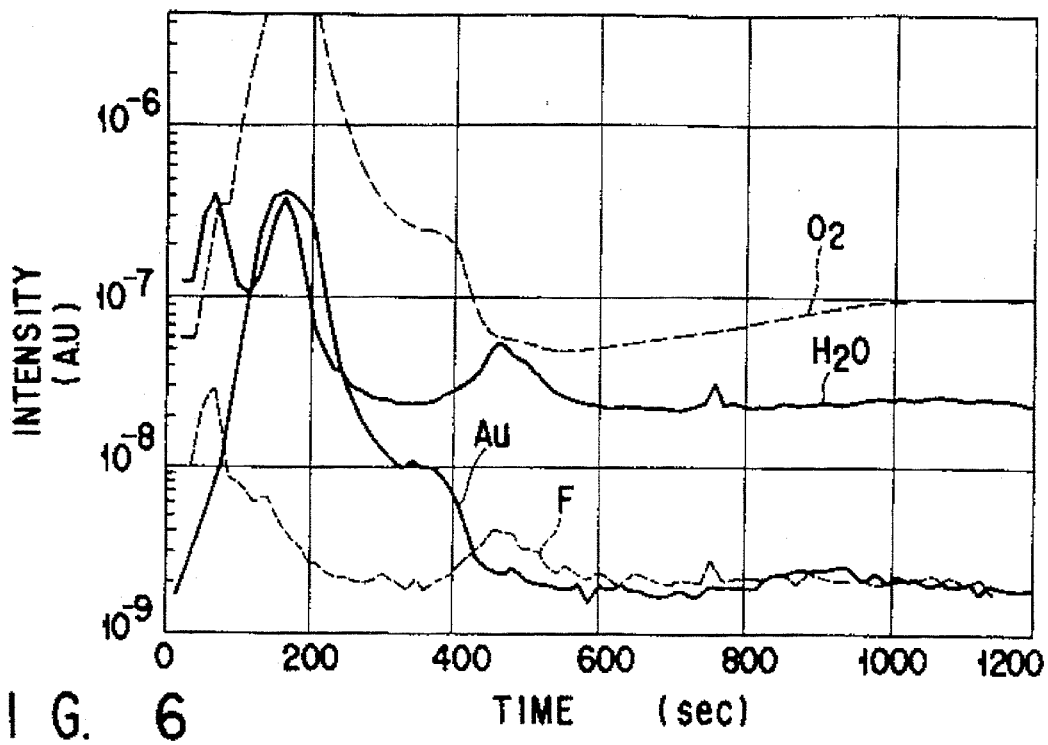
FIG. 6 is a graph showing analysis of a gas released by heating.
Figure 7:
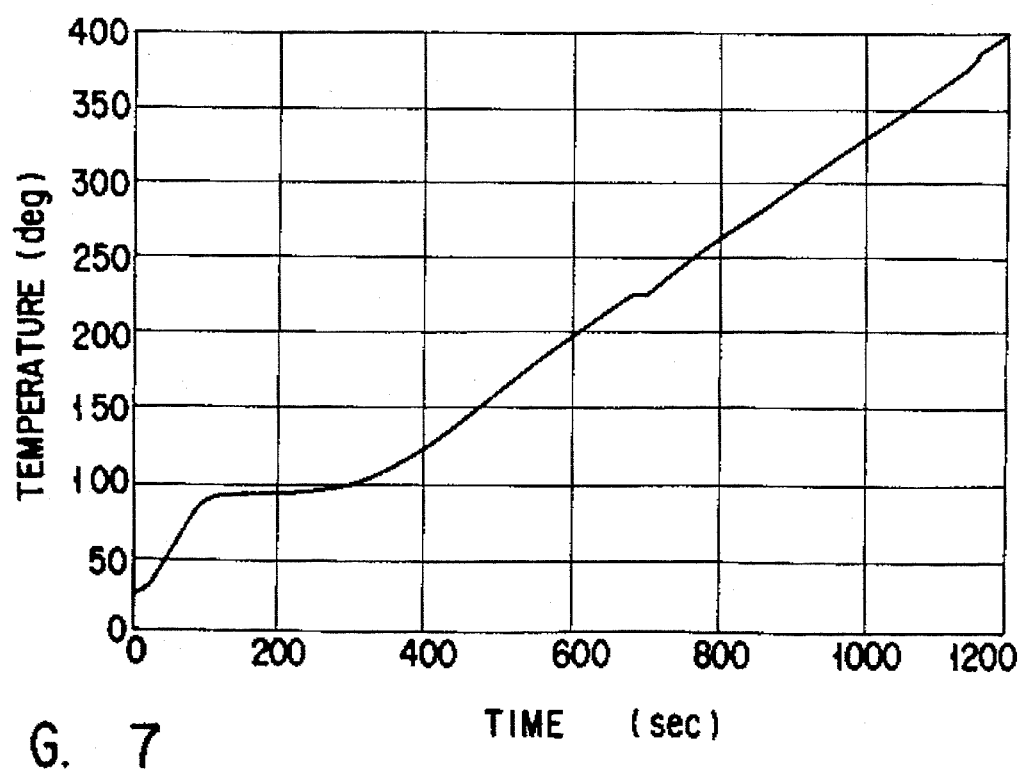
FIG. 7 is a graph showing a relationship between time shown in the lateral axis of FIG. 5 and the temperature.

FIG. 6 shows analysis results of a gas released by the above heating in the vacuum. In addition, FIG. 7 shows a relationship between time in the lateral axis of FIG. 6 and the temperature. From FIG. 6, it is apparent that a release of gold oxide starts when about 90 seconds have passed, i.e., at a temperature of about 90° C. (i.e., the detection amount of oxygen and gold atoms increases). Then, a release of atoms ceases at a temperature of about 120° C. Further, heating in this temperature range (to 150° C.) make a slight distortion to the mechanical placement accuracy of an electrode, and the electrode is thermally insulated from peripheral portions, so that there is little possibility that bad influences appear in peripheral mechanisms and constructing members.

As has been explained above, according to the present embodiment, the passage of introduced plasma or active species is limited to a space surrounded by the surface of cleaning portions to be cleaned, so that reduction in substances which serve as a factor causing a charged beam to drift can be improved without losing the cleaning ability of the active gas and the drifting amount can be restricted to the substantially same level as a new product.

Further, since an introducing port and an exhausting port are provided for each of cells, there is no problem that cleaning effects of plasma or active species decrease because of the orifice. In addition, uniform processing can be performed with use of plasma of a low power, and oxidation and fluorination of gold can be minimized. Specifically, when the inside of the column is divided into a plurality of cells by apertures having a small exhausting conductance as in a conventional method, components of plasma or active species contributing to cleaning such as active species are lost, and effective cleaning ability is substantially lost, when only one introducing port and only one exhausting port exist. As a result, contaminants cannot be cleaned in the downstream side of the apertures.

In addition, even in case where an introducing port and an exhausting port are provided for each of cells, active species and the likes expand into or are deactivated at the portions other than the cleaning surface to be cleaned, thereby lowering the cleaning effect if passages of plasma or active species between the introducing and exhausting ports are not restricted to the spaces surrounded by the surface of the cleaning portions to be cleaned, that is, if there is the cleaning gas which is exhausted without passing through the cleaning portions to be cleaned. In particular, when the space surrounded by the surfaces of the cleaning portions to be cleaned is small, a difference of cleaning effect between at the upstream and down stream sides is large. When a cleaning surface to be cleaned having a length of about 10 cm is cleaned, sufficient cleaning effects can be obtained in the upstream area and cleaning effects are completely lost in the portions of the down-stream side. In this case, if passages of plasma are restricted as in the present embodiment, conventional cleaning effects can be obtained in the upstream side of plasma or active species, and the substantially same (about ½) cleaning effects can be obtained in the down-stream side of plasma or active species.

In addition, as a result of restricting passages of plasma, those portions where corrosion of peripheral portions must be avoided are protected.

FIG. 8 is a view for explaining a method of estimating an trajectory change by means of contaminants. When contaminants of the cleaning portions 9 to be cleaned are charged, drifting of an electron beam occurs, but the amount of drifting can be estimated by a change in the amount of a current flowing into a Faraday cup provided below the apertures. Specifically, as shown in FIG. 8, a part of an electron beam 19a is interrupted by apertures 5, and the remaining part of the electron beam flows into the Faraday cup 17. If time passes while maintaining this state, the trajectory of the electron beam is changed thereby causing drifting under influence of charged contaminants, and the electron beam 19b moves to the position indicated by a broken line. In this while, the area interrupted by the apertures changes, and as a result, the amount of the electron beam (i.e., the current amount) flowing into the Faraday cup 17 changes. This change in the current amount, i.e., the drifting amount is shown in FIGS. 9, 10, and 11.

Figure 9:
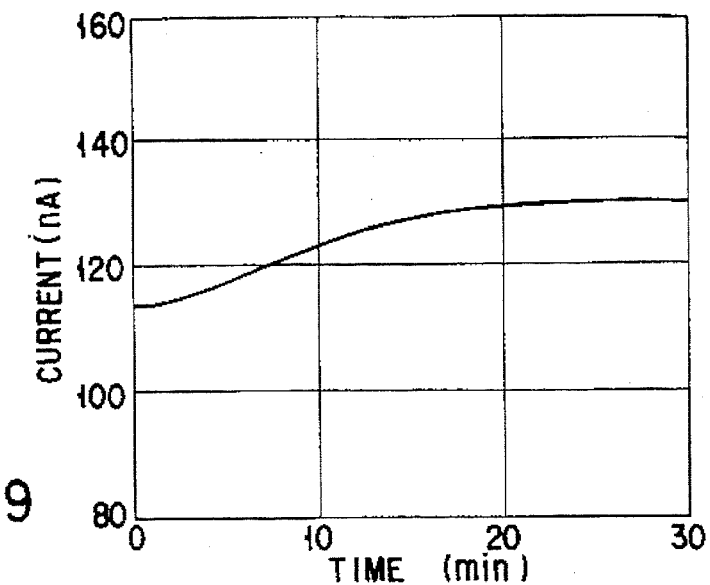
FIG. 9 is a graph showing a drifting amount of an electron beam before cleaning.

FIG. 9 shows the drifting amount and shows that the electron beam drifts under influence of contaminants.

Figure 10:
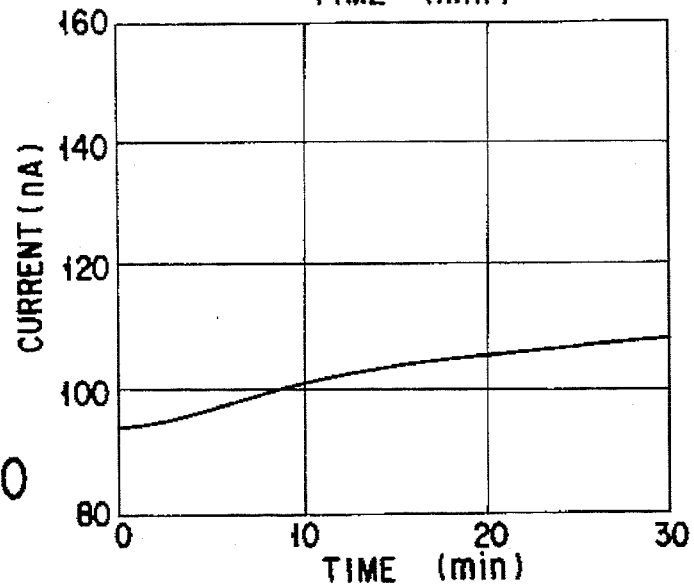
FIG. 10 is a graph showing a drifting amount of an electron beam after conventional cleaning is performed.

FIG. 10 shows the drifting amount of the electron beam after conventional cleaning is performed, and it is apparent from this figure that the amount of electron beam still changes although the drifting amount more or less decreases. This change is caused due to influences from an oxide film formed on the surface of an electrode.

Figure 11:
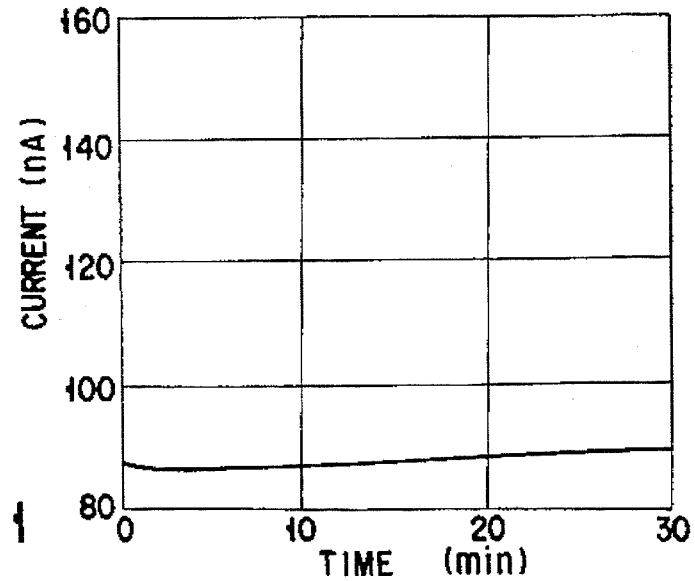
FIG. 11 is a graph showing a drifting amount of an electron beam after cleaning is performed according to the present invention.

FIG. 11 shows the drifting amount of the electron beam after cleaning is performed according to the present embodiment, and in comparison with FIG. 7 (before plasma cleaning), the drifting amount of the electron beam is substantially reduced to 0. In addition, heating of an electrode in this state is performed at 120° C. for 10 minutes.

In addition, as means for maintaining a differential pressure, an orifice having a sufficiently small conductance and a pump may be used to perform differential exhaustion, to construct such a structure in which a sufficient differential pressure is maintained between the column 51 and the exposure chamber 58.

Second Embodiment

Figure 12:
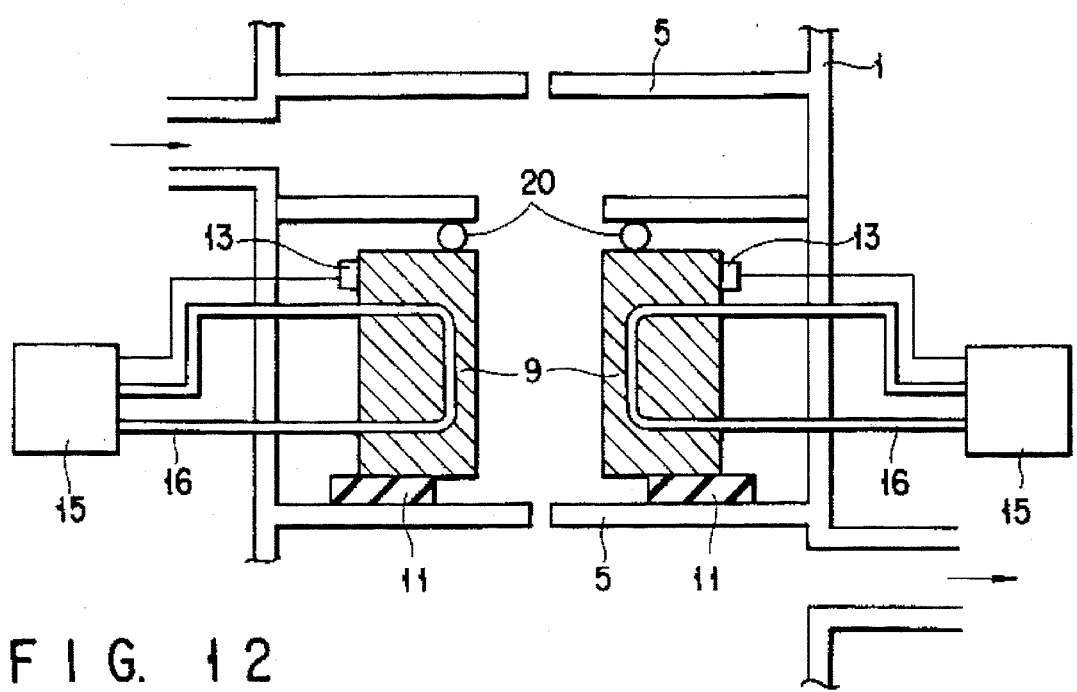
FIG. 12 is a view showing the schematic structure of an electron beam exposure apparatus having a cleaning function according to the second embodiment of the present invention.

FIG. 12 is a view schematically showing the structure of an electron beam exposure apparatus having a cleaning function provided with a mechanism for cleaning the inside of the column according to a second embodiment of the present invention. In addition, those portions in FIG. 2 which correspond to the electron beam exposure apparatus having a cleaning function are denoted by the same references, and detailed explanation thereof will be omitted herefrom. The difference between the electron beam exposure apparatus having a cleaning function and the first embodiment exists in that heating means of the cleaning portion to be cleaned. Specifically, cleaning portions 9 to be cleaned are heated with use of liquid in the second embodiment. The cleaning portions 9 to be cleaned are connected with a thermostatic chamber 15 by a pipe 16, and further, this pipe 16 circulates inside the cleaning portions 9 to be cleaned, so that the cleaning portions 9 are heated by a fluid heated by the thermostatic chamber 15. In FIG. 12, a thermo couple 13 is arranged such that the temperature of cleaning portions 9 to be cleaned are measured. The thermo couple 13 may otherwise be arranged such that the temperature of an outlet and an inlet of the pipe 19 is measured. In each of these arrangements, feed back control is performed such that the temperature of the cleaning portions 9 to be cleaned can be maintained to be constant. In addition, as the liquid stated above, a fluid such as a gas, water, oil, or the like and liquid metal are appropriately selected in view of the setting temperature and the control range. Note that when portions other than the cleaning portions 9 to be cleaned need to be maintained at a low temperature where heating is performed during steady-state operation, a temperature adjusting mechanism consisting of a pipe, a thermostatic chamber, a thermo couple, and the likes may be provided so that a liquid of a low temperature flows through the portion which should be maintained at a low temperature, like in the case of cleaning portions 9.

The cleaning method in the second embodiment is basically the same as that of the first embodiment. That is, after cleaning is performed in the same manner as in the preceding embodiment, the inside of the column 1 is exhausted to a pressure of $10^{-6}$ Torr or less. The liquid flowing through the cleaning portions 9 to be cleaned is heated so that the cleaning portions 9 to be cleaned are heated to 120° C. Thereafter, when the temperature reaches 120° C., the temperature is maintained to be constant for ten minutes, while a releasing gas in the column 1 is exhausted. As a result, oxide films formed on the surfaces of the cleaning portions 9 to be cleaned are released, and exhausted to the outside of the column 1. The cleaning portions 9 having clean surface are obtained.

In addition to these effects as in the first embodiment, the following effects inherent to the second embodiment are obtained. Specifically, in the second embodiment, heating is performed with use of a liquid, and the electric conductivity needs not be performed. Therefore, magnetic and electric fields used for deflection are not disordered during heating. Therefore, heating can be performed during steady-state operation, and due to this heating, growth of contaminants can be delayed. As a result, advantages can be obtained in that cleaning intervals can be elongated and drawing precision can be improved.

In addition, as means for maintaining a differential pressure, an orifice having a sufficiently small conductance and a pump may be used to perform differential exhaustion, to construct such a structure in which a sufficient differential pressure is maintained between the column 51 and the exposure chamber 58.

Third Embodiment

Figure 13:
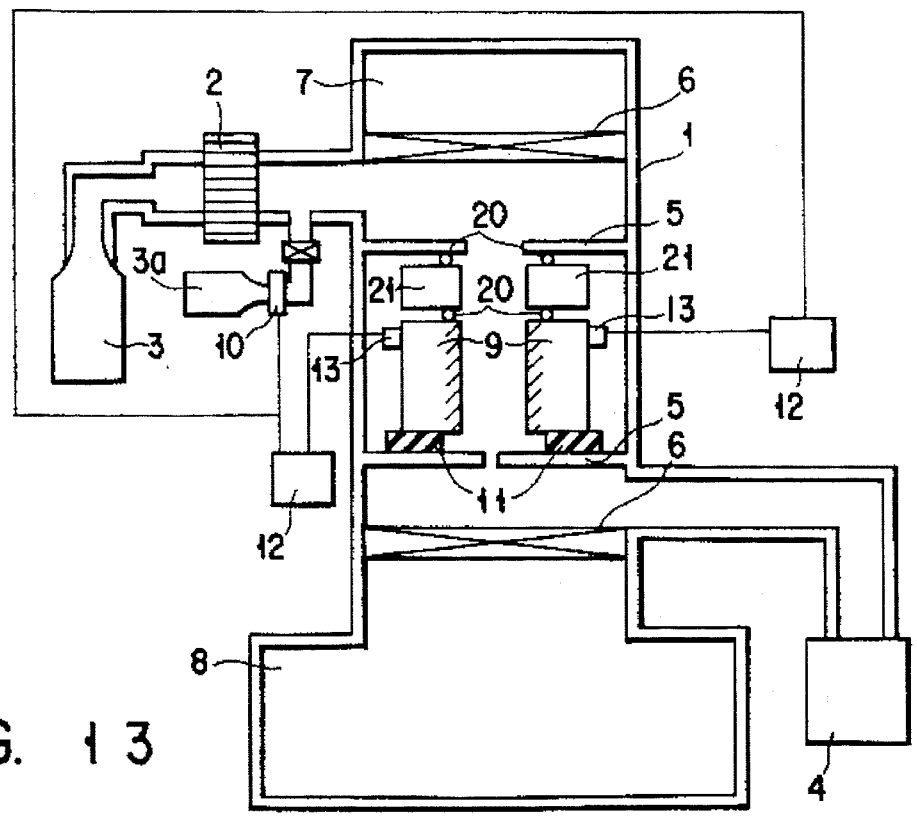
FIG. 13 is a view showing the schematic structure of an electron beam exposure apparatus according to the third embodiment of the present invention.

FIG. 13 is a view schematically showing the structure of an electron beam exposure apparatus having a cleaning function provided with a mechanism for cleaning the inside of the column, according to the third embodiment of the present invention. The electron beam exposure apparatus having a cleaning function of the third embodiment differs from that of the first embodiment in that a heated gas is used as means for heating cleaning portions 9 to be cleaned. To realize this means, a source tank 3a is additionally attached in this embodiment. In addition, as in the first embodiment, it is arranged such that the temperature of cleaning portions 9 to be cleaned is monitored by a thermo couple 13 and the temperature of the cleaning portions 9 to be cleaned are maintained at a constant temperature. Here, in place of cleaning portions 9 to be cleaned, the temperature of an exhausting port can be monitored. Further, when passages of a gas are not restricted by only an O-ring 20, an adapter ring 21 and an O-ring 20 may be combined with each other so that the passages of plasma are restricted to those portions which are surrounded by the cleaning surfaces to be cleaned. In addition, the present invention is not limited to the embodiments as explained above, but the present invention can be variously modified and practiced as follows. For example, electrodes is cited as cleaning portions to be cleaned and gold is cited as the material of the electrodes, in the above three embodiments. The present invention is effective for other material (e.g., platinum and the like) used for the other portions (e.g., apertures and the likes). In this case, since oxide films and the likes are formed on the surfaces after cleaning, the cleaning effects of the present invention can be improved by providing heating means to increase the temperature and release oxide films. The set temperature, the heating time, and the heating temperature gradient may be appropriately selected, depending on the material, the degree of vacuum, and the oxidation. In addition, explanation of the first and third embodiments have been made with respect to only the case where heating means is provided at the cleaning portions to be cleaned. If necessary, heating means may be provided at the portions other than the cleaning portions to be cleaned, thereby to release oxide films. If only one portion is heated by appropriately increasing the heat conductivity, all the necessary portions can be heated.

As means for restricting passages of plasma, the following components may be used. Specifically, the conductance may be sufficiently reduced by providing a cover 22, in place of using an O-ring to make passages hermetic, i.e., to substantially prevent plasma from leaking into other passages, as in the above embodiments. If Ni which easily deactivates an activating gas is used as material of this cover 22, material of peripheral portions can be prevented from corroding.

Of course, use of an O-ring or the like to make the passages hermetic is more effective than the means shown in FIG. 14. The O-ring used in this state may be formed of material such as biten or the like, or material having corrosion resistance, e.g., carlets may be used when corrosion is a significant problem. Otherwise, a metallic gasket may be used.

In addition, as other means for restricting passages of plasma, as shown in FIG. 15, there is a method of covering peripheral portions of the cleaning portions 9 maintained at a predetermined position with an cylinder 23. This cylinder 23 may be formed of metal such as SUS, or may be appropriately selected in accordance with applications.

Further, in case where passages of plasma are restricted within the inside of the cleaning surface to be cleaned, there is a possibility that vacuum exhausting cannot be efficiently performed. In this case, a gate or the like may be provided so that passages of a gas are appropriately switched between during cleaning and during steady-state operation.

In addition, as means for maintaining a differential pressure, an orifice having a sufficiently small conductance and a pump may be used to perform differential exhaustion, to construct such a structure in which a sufficient differential pressure is maintained between the column 51 and the exposure chamber 58.

Fourth Embodiment

FIG. 16 is a view schematically showing the structure of an electron beam exposure apparatus having a cleaning function provided with a mechanism for cleaning the inside of the column, according to the fourth embodiment. At upper and lower portions in the column 31, gate valves 36 are provided above and below the column 31. By these gate valves 36, the inside of the column 31 can be separated into a beam generating portion 37 for generating an electron beam, an exposure chamber for containing a sample, and an optical system, with respect to vacuum condition. Gate valves 36 are provided at upper and lower portions of the column 31. In addition, apertures 35 are provided in upper and lower portions inside the gate valves 36, and deflection electrodes 39 are provided inside these apertures. Further, an exhausting port provided in the side of the lower gate valve 36 is connected with an exhausting pump 34, such as a dry pump, a rotary pump, or the like. A plasma generating portion 32 is provided outside the column 31, and the plasma generating portion 32 is supplied with a plasma source gas from one of the first source tank 33 containing a gas for pre-cleaning and the second source tank 40 containing a gas for after-cleaning. Thereafter, a plasma source gas is microwave-excited and plasma is generated. The first source tank 33, for example, contains a gas mixture of $O_2$ and $CF_4$ as a gas for pre-cleaning. In addition, for example, $H_2O$ is contained in the source tank 40 for after cleaning.

In the next, a method of cleaning the inside of the column 31 of an electron beam exposure apparatus having a cleaning function will be explained. At first, a pre-cleaning gas (i.e., a gas mixture of $O_2$ and $CF_4$) contained in a first source tank 33 is selectively supplied to a plasma generating apparatus 32 by a switching valve 41, and plasma or active species of the above gas is made flow into a column 31, so that internal contaminants of a hydrocarbon group sticking to surfaces of apertures 35 and deflection electrodes 39 are oxidized and vaporized, thereby removing internal contaminants. In this state, the surfaces of the apertures 35 and the deflection electrode 39 are formed of gold. Further, a vaporized gas is exhausted to the outside through an exhausting port by a pump 34. In this state, the surfaces of cleaning portions are oxidized and fluorinated as in a conventional method. In the next, an after-cleaning gas ($H_2O$ gas) is selectively supplied to a plasma generating apparatus 32 via a switching valve 41, and plasma of the above gas or active species are made flow into a column 31, thereby to remove an oxide film and fluoride film formed on the surface of the cleaning portions. There are several mechanisms by which oxide and fluorided films are removed. For example, the oxidized surfaces of cleaning portions are deoxidized by the plasma of an $H_2O$ gas. In this state, a gas supplied into the column 31 and a gas generated by deoxidization are exhausted by a pump 34. In addition, the fourth embodiment adopts a method of switching the first and second source tanks by means of valves. Otherwise, after-cleaning may be performed by detaching the first source tank and attaching the second source tank after pre-cleaning is performed with the first source tank being attached.

Thus, according to the fourth embodiment, oxide and fluoridation films which serve as factors causing drifting generated from the pre-cleaning can be removed after the pre-cleaning is performed. Therefore, drawing can be performed at high precision. Further, according to the fourth embodiment, oxide films and the likes can be removed if only the second source tank containing an after-cleaning gas, the first source tank containing a pre-cleaning gas, and the valve for switching the second source tank are added to a conventional electron beam exposure apparatus having a cleaning function. As a result, the structure of the apparatus is simplified in comparison with removal of oxide films and the likes by means of heating. In addition, a problem of degradation in mechanical accuracy of a column due to heating is not caused.

In the fourth embodiment, a significant point exists in a combination between material of cleaning portions and an after-cleaning gas. Specifically, the surfaces of cleaning portions may be formed of gold, platinum, palladium, or an alloy thereof, and an $H_2O$ gas, an $N_2$ gas, an $H_2$ gas, a rare gas (or an inactive gas), or a gas mixture including these gases is used as an after-cleaning gas, so that oxide films formed by a pre-cleaning step can be efficiently removed.

In the following, the above will be specifically explained. At first, when the surfaces of cleaning portions are formed of gold, a gas mixture of $O_2$ and $CF_4$ is used to remove contaminants sticking to or formed on surfaces of gold members, the surfaces of the gold members are oxidized.

FIG. 17A is a graph showing results of XPS measurements performed on the surfaces of gold materials cleaned with use of the above pre-cleaning gas. From FIG. 17A, it is known that satellites of gold ($Au_2O_3$) appear in addition to spectra of gold (Au) which is original material. Here, if plasma (an activating gas) generated by discharging an $H_2O$ gas as an after-cleaning gas onto oxidized surfaces of gold is supplied, the oxidized films on the surface of gold members are removed. FIG. 17B is a graph showing results of XPS measurements performed on the surfaces of gold members having oxidized surfaces which are cleaned with use of an after-cleaning gas. From FIG. 17B, satellites of Au ($Au_2O_3$) are lost, and the same spectrum as in the case of completely clean gold (Au) are obtained. That is, it is apparent from FIGS. 17A and 17B that substantially complete cleaning effects can be obtained in case of a combination of an $H_2O$ gas and gold.

FIG. 18A is a graph showing results of XPS measurements performed onto nickel members having oxidized surfaces. It is known from FIG. 18A that two spectra of Ni and two satellites of Ni appear. FIG. 18B shows results of XPS measurements after cleaning is performed with use of plasma generated by discharging an $H_2O$ gas. It is known from FIG. 18B that oxidized satellites of Ni ($Ni_xO_y$) still remain. That is, sufficient cleaning effects cannot be obtained in case of a combination of an $H_2O$ gas and nickel.

In addition, according to researches made by the present inventors, a method of removing oxide films by means of heating reveals the following facts. Specifically, sufficient cleaning effects cannot be obtained, depending on the materials of cleaning portions, like in the removing method of this embodiment.

Figure 19A:
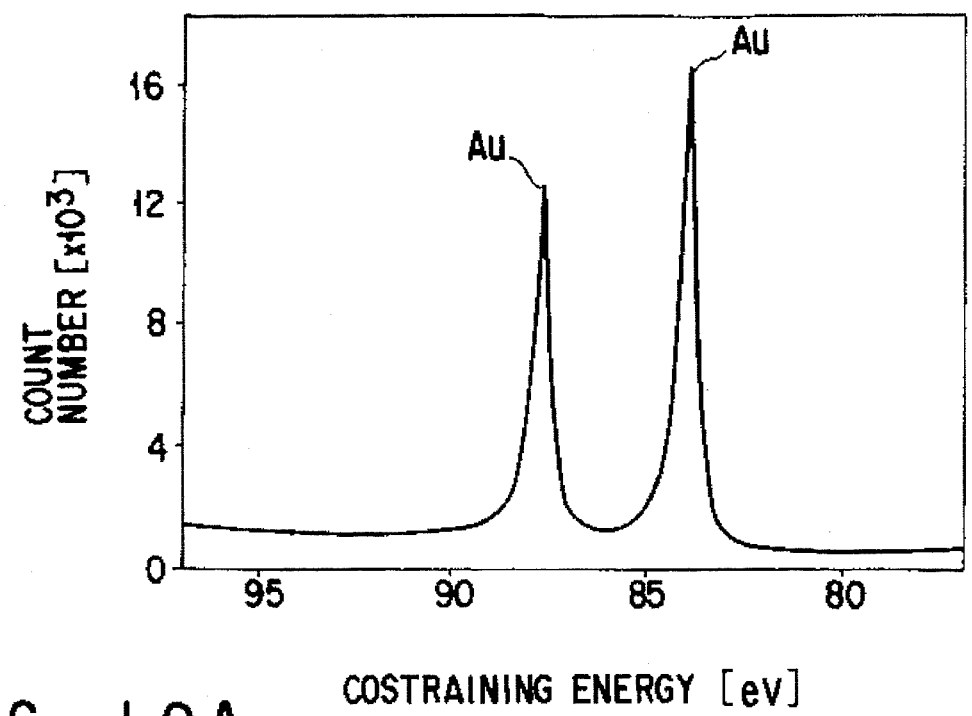
FIGS. 19A and 19B are graphs showing results of XPS measurements which explain the dependence of material of a cleaning member.
Figure 19B:
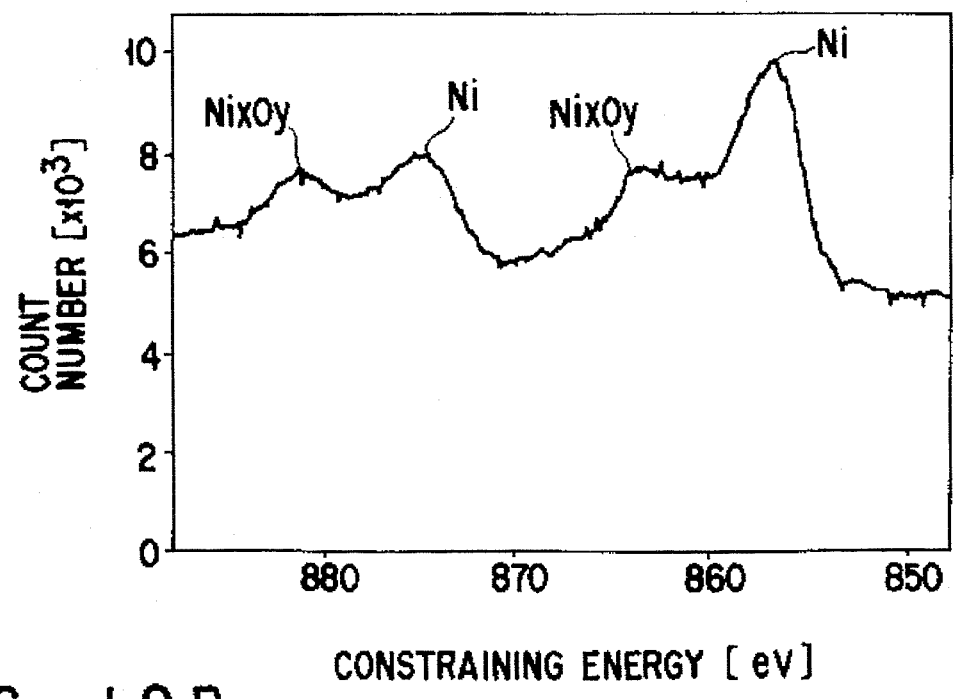

FIGS. 19A and 19B are graphs showing results of XPS measurements which indicate the above, and FIG. 19A shows spectra where gold members having oxidized surfaces are heated at a temperature of 150 degree, while FIG. 19B shows spectra where nickel members having oxidized surfaces are heated at 150 degree. From FIGS. 19A and 19B, it is known that satellites of gold ($Au_2O_3$) are lost in case of using gold so that substantially complete cleaning effects are obtained, while satellites of nickel ($Ni_xO_y$) remain in case of using nickel so that sufficient cleaning effects cannot be obtained. Therefore, the method of removing the oxide film shown in the first to third embodiments is effective only when the material of the surface of the cleaning portion to be cleaned is appropriately selected. Such materials are Au, Pt, Pd or an alloy thereof. The same results obtained as in the case of gold are obtained with respect to an alloy of gold, platinum, and an alloy of platinum.

In addition, as means for maintaining a differential pressure, an orifice having a sufficiently small conductance and a pump may be used to perform differential exhaustion, to construct such a structure in which a sufficient differential pressure is maintained between the column 51 and the exposure chamber 58.

Fifth Embodiment

FIG. 20 is a view schematically showing the structure of an electron beam exposure apparatus having a cleaning function according to the fifth embodiment of the present invention. In FIG. 20, reference 51 denotes a column of an electron beam exposure apparatus, and gate valves 56 are provided above and below the column 51. By these gate valves 56, the inside of the column 51 can be isolated from an electron beam generating portion 57 for generating an electron beam and an exposure chamber 58 for containing a sample. In addition, as means for maintaining a differential pressure, an orifice having a sufficiently small conductance and a pump may be used to perform differential exhaustion, to construct such a structure in which a sufficient differential pressure is maintained between the column 51 and the exposure chamber 58. Further, a plasma generating portion 52 is provided outside the column 61, and a gas supplied from a source tank 53 is subjected to microwave-discharging, thereby to generate plasma. This plasma is made flow into the column 51. Grids 60 and 61 are provided at a portion for introducing plasma, so that positive and negative electric potentials can respectively be supplied to the grids 60 and 61, with respect to the plasma generating portion. Specifically, active species introducing means is constituted by grids 60 and 61.

Positive and negative ions are repelled by these grids 60 and 61 so that the ions cannot flow into the column 51. In this manner, only electrically neutral active species can be selectively introduced into the column 51. These active species react with contaminants sticking to apertures (orifices) 55 and an electrostatic deflector 59 in the column 51, are evaporated, and are exhausted by an exhausting pump 54.

Sixth Embodiment

FIG. 21 is a view schematically showing the structure of an electron beam exposure apparatus having a cleaning function according to the sixth embodiment of the present invention. In addition, those portions of FIG. 20 corresponding to the portions of the electron beam exposure apparatus having a cleaning function are denoted by the same references as in FIG. 20, and detailed explanation thereof will be omitted herefrom. The electron beam exposure apparatus having a cleaning function of the sixth embodiment differs from the apparatus of the fifth embodiment in that O-rings 65 are provided above and below the deflector 59. The deflector 59 is retained at a predetermined position by means not shown. As a result, cleaning portions to be cleaned can efficiently be cleaned by active species selectively introduced into the apparatus through the grids 60 and 61, and damages to peripheral portions can be prevented.

Figure 22:
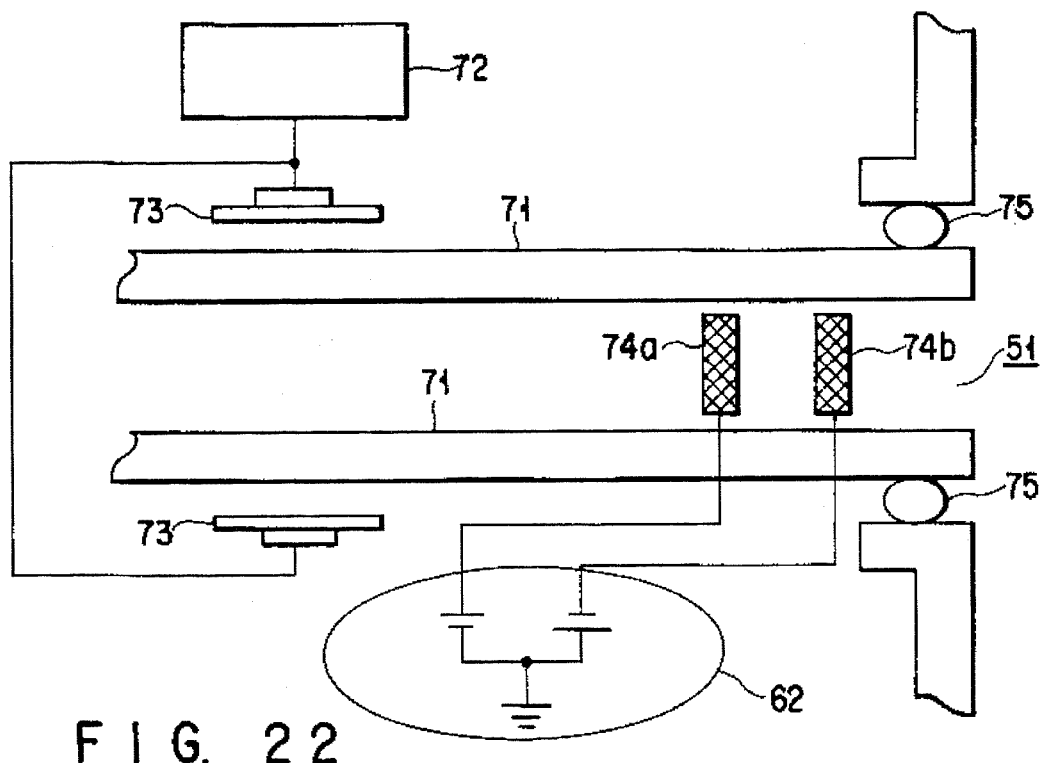
FIG. 22 is a view showing a specific structure of means for introducing active species.

FIG. 22 is a view showing another active species introducing means. In FIG. 22, reference 72 denotes a power source for a microwave, and reference 73 denotes a cavity for microwave discharging. This cavity 73 is grounded. In addition, references 74a and 74b denote grids for generating an electrostatic field, and the grids 74a and 74b are respectively applied with voltages of +20 V and −20 V. In addition, reference number 71 denotes a discharge tube made of quartz for the plasma generating portion. A gap exists between the discharge tube 71 and the grids 74a and 74b, and this gap is small enough to maintain an electric field for repelling back ions. Reference 75 denotes an O-ring.

As explained above, positive and negative electric potentials are respectively applied to grids 74a and 74b, so that ions of a gas which have been changed into plasma by discharging of the cavity 73 are repelled by the grids 74a and 74b. Therefore, only those active species which flow into the column 51 are electrically neutral active species.

Figure 23:
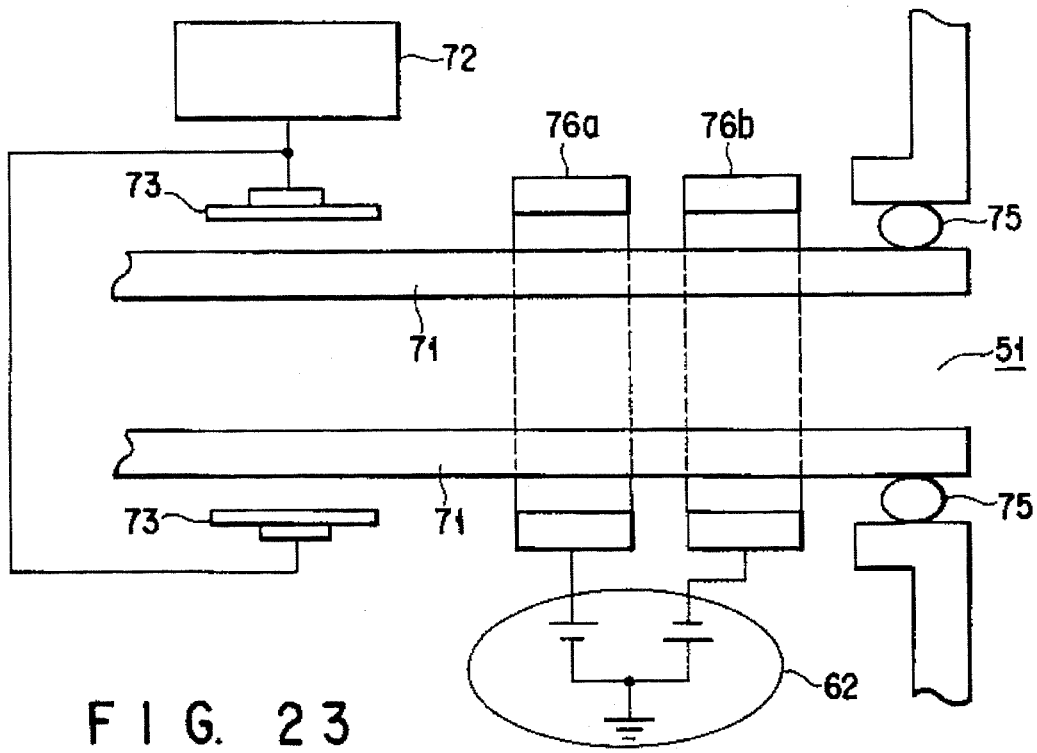
FIG. 23 is a view showing a specific structure of another means for introducing active species.

FIG. 23 is a view showing another active species introducing means. Since the discharge tube 71 is made of quartz as explained above, i.e., since the discharge tube 71 is made of electrically insulating material, ions can be returned back if cylindrical electrodes 76a and 76b are provided outside the discharge tube 71, and positive and negative voltages are respectively applied to these electrodes 76a and 76b, thereby to form an electrostatic field. Therefore, it is possible to selectively introduce electrically neutral active species into the column 51.

FIG. 24 is a view showing another active species introducing means. In this figure, reference 70 denotes a discharge tube, and this discharge tube 70 is constructed by alternately providing portions made of quartz and metal. In this figure, references 77 and 78 denote portions made of metal. If positive and negative voltages are respectively applied to metallic portions, electrically neutral active species can be selectively introduced into the column 51, as in case of FIG. 22.

FIG. 25 is a view showing another active species introducing means. A voltage of −20 V with respect to an earth is applied to the cavity 73. Positive ions are therefore enclosed in the region of the cavity. In this state, negative ions go out while being accelerated. However, since negative ions can be repelled by applying a negative voltage to an electrode 79, electrically neutral active species can be selectively introduced into the column 51, like in the case of FIGS. 22 and 24. Although a cylindrical electrode is used in this embodiment, an electrode of a grid type may be used.

Meanwhile, the active species introducing means shown in FIGS. 22 to 25 must be appropriately used, depending on the density (i.e., electron density), the temperature, and the likes of plasma used for generation of active species. For example, when the electron density is higher than the electron temperature to some extent, shielding effects are produced. Therefore, it is preferable to use a cylindrical electrode rather than a grid-type electrode. The size of a mesh of grids must be adjusted if necessary.

Seventh Embodiment

Figure 26:
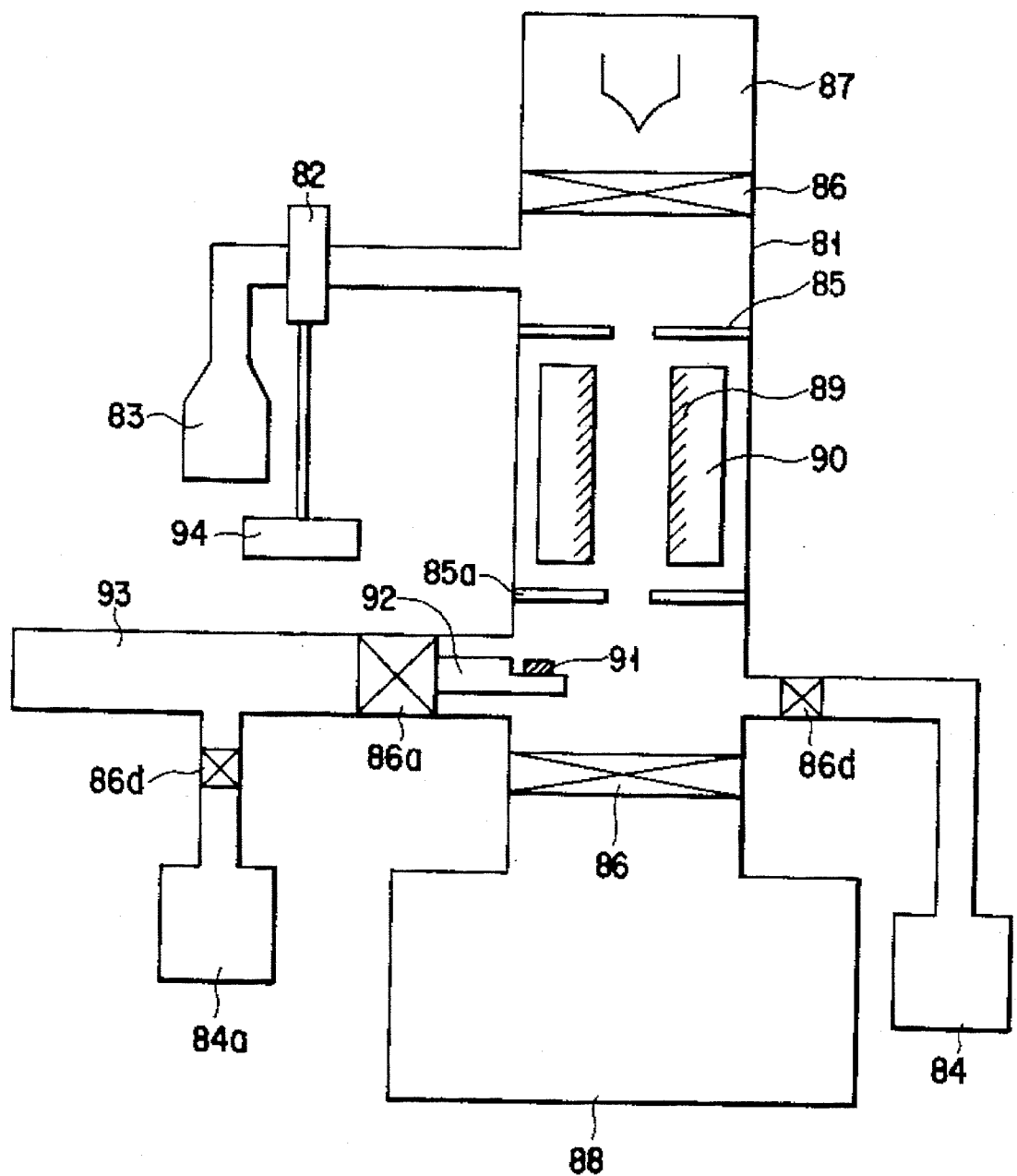
FIG. 26 is a view showing a schematic structure of an electron beam exposure apparatus having a cleaning function provided with a mechanism for cleaning the inside of the column according to the seventh embodiment of the present invention.

FIG. 26 is a view schematically showing the structure of an electron beam exposure apparatus having a cleaning function according to the seventh embodiment of the present invention. In FIG. 26, a reference 81 denotes a column of an electron beam exposure apparatus, and gate valves 86 are provided above and below the column 81. By these gate valves 86, the inside of the column 81 can be separated from the electron beam generating portion 87 for generating an electron beam and the exposure chamber 88 for containing a sample. In addition, as means for maintaining a differential pressure, an orifice having a sufficiently small conductance and a pump may be used to perform differential exhaustion, to construct such a structure in which a sufficient differential pressure is maintained between the column 51 and the exposure chamber 58. In addition, a plasma generating portion 82 is provided outside the column 81, and a reference 94 denotes a controller of the portion 82. This plasma generating portion 82 generates plasma by microwave-exciting a gas source (e.g., a gas mixture of $O_2$ and $CF_4$) of plasma or active species supplied from the source tank 83. The plasma is subjected to re-coupling before flowing into the column 81, so that the plasma is mainly composed of electrically neutral active species. The active species flow into the column, and react with contaminants 89 sticking to the surfaces of apertures 85 and the electrostatic deflector 90. Then, they are evaporated and removed by exhaustion. The electro-static deflector 90 is retained at a predetermined position by means not shown. Further, a sample 91 and a sample holder 92 mounting this sample 91 are comprised in the down-stream side of the aperture 85a at a lower portion of the column, in order to measure how cleaning proceeds. The sample 91 can be conveyed into and conveyed out of a preparatory chamber 93 partitioned by a gate valve 86a. If a glass window is provided in the preparatory chamber, the condition of the sample 91 can directly be checked from the glass window. That is, conveying out of the sample 91 is performed by conveying out the sample holder 92 from the column 81 after the inside of the preparatory chamber 93 is exhausted by the exhausting pump 84a with the gate valve 86a being closed and the gate valve 86d being opened. Meanwhile, the conveying in of the sample 91 is performed by opening the gate valve 86a and conveying out the sample holder 92 after the inside of the preparatory chamber 93 is exhausted by the exhausting pump 84a with the gate valves 86a and 86d being closed. In addition, the exhausting pump 84 may be commonly used as the exhausting pump 84a of the preparatory chamber 113, in such a manner in which a valve or the like is used to switch the pump 84. In addition, the setting position of the sample 91 should preferably be close to the portion where cleaning effects are minimum among those portions which require cleaning in the used column 81.

In the seventh embodiment, carbon formed as a film on a silicon substrate is used as a sample 91. This carbon film has a thickness of about 1 micron. In case of an electron beam exposure apparatus, this thickness is estimated as a sufficiently thick thickness which is hardly seen in a thickness of contaminants. After a predetermine time has passed during cleaning, a sample 91 is conveyed out of the column 81, while cleaning of the column 81 continues. Then, the state where a carbon film of the sample 91 is etched is observed. If the carbon film is not completely removed, the sample 91 is returned into the column 81, and cleaning is performed until completion of removal of the carbon film is confirmed. In this manner, in a step in which a carbon film is completely removed, completion of cleaning is confirmed.

In addition, the thickness of a carbon film must be appropriately be determined, depending on operational states of the apparatus. Otherwise, a resist can be used in place of carbon. Basically, the carbon film may be substituted by a material which can be etched in a cleaning gas atmosphere. Further, as a sample 91 or a substrate forming a resist, the same material used for cleaning portions to be cleaned may be used in place of a silicon substrate. The material can otherwise be selected appropriately.

Eighth Embodiment

Figure 27:
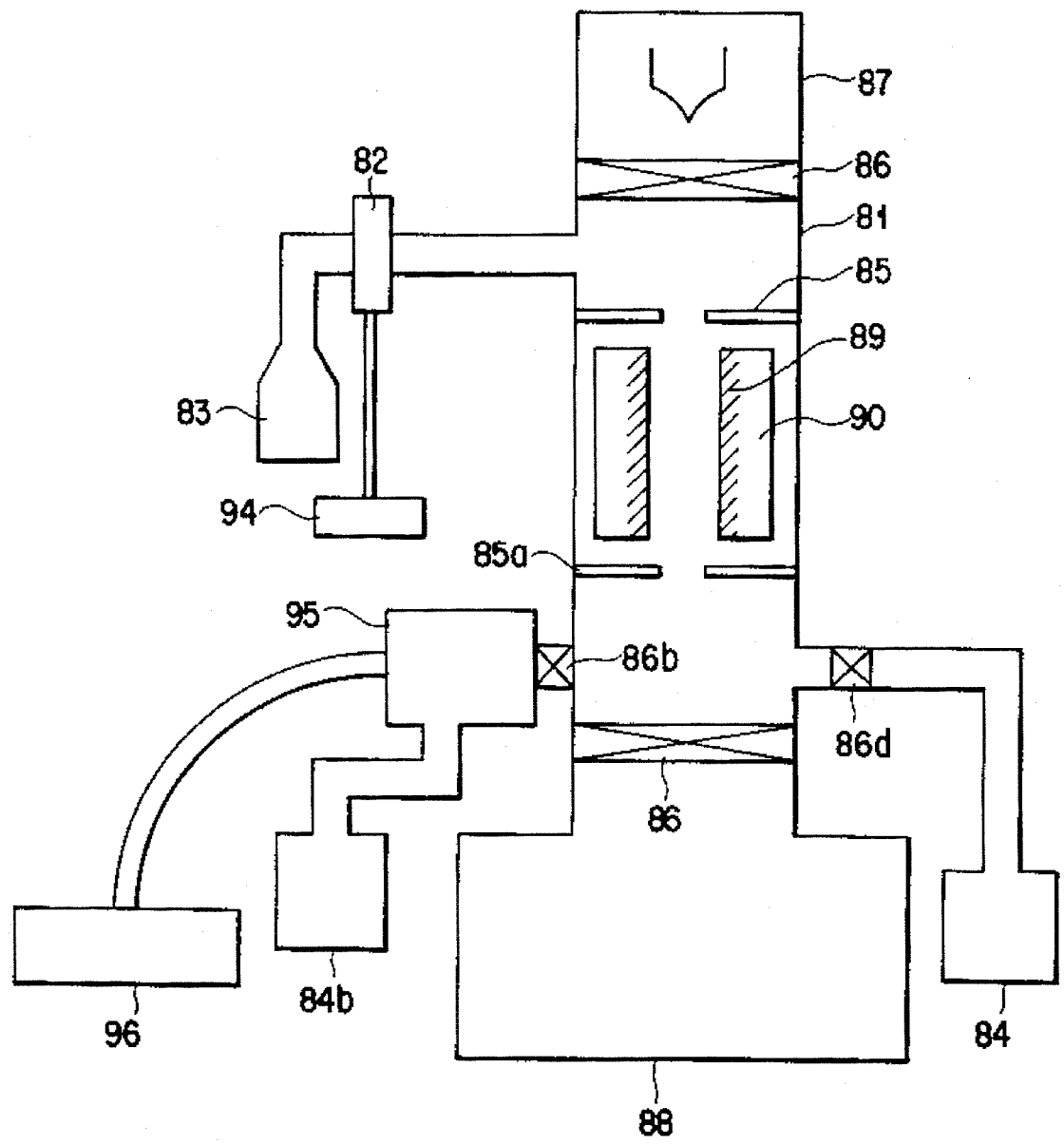
FIG. 27 is a view showing a schematic structure of an electron beam exposure apparatus having a cleaning function provided with a mechanism for cleaning the inside of the column according to the eighth embodiment of the present invention.

FIG. 27 is a view schematically showing the structure of an electron beam exposure apparatus having a cleaning function according to the eighth embodiment of the present invention. Note that those portions of this apparatus which correspond to the portions of the apparatus of FIG. 26 are denoted by the same references, and detailed explanation thereof will be omitted herefrom. The electron beam exposure apparatus according to the eighth embodiment differs from the apparatus according to the seventh embodiment in that the amount of active species is used to monitor the degree of accomplishment of removal of internal contaminants. Specifically, the down-stream of the lower aperture 85a of the column 81 is connected to a quadruple mass spectrograph 95 through a gate valve 86b, and this quadruple mass spectrograph 95 is operated and exhausted by an exhausting pump 84a. In addition, reference 96 denotes a controller of the quadruple mass spectrograph 95. The gate valve 86b has a small exhausting conductance, and the quadruple mass spectrograph 95 is operational even during cleaning, due to the gate valve 86b. A sufficient differential pressure is ensured between the column 81 and the quadruple mass spectrometer 95.

Monitoring is actually performed as follows. Specifically, active species, e.g., the amount of active species is measured during cleaning. A large amount of contaminants exists immediately after cleaning is started, and active species react with contaminants, so that the amount of detected active species is small relatively. However, as cleaning proceeds, the amount of active species which do not react increases, so that the amount of detected active species increases. The step in which the detection amount is saturated indicates an end of cleaning.

In addition, in place of measuring the amount of active species, the amount of reactants obtained from active species and contaminants may be measured. In this case, a step in which the amount of formed substances decreases and formed substances cannot be detected any more indicates an end of cleaning.

Further, since the quadruple mass spectrograph causes decomposition of molecules in the spectrograph itself, it may be preferable that measurements should be performed with respect to not one mass amount, but with respect to a plurality of mass amounts and changes in spectra should be observed, in accordance with the amount of a gas and the kind of a gas. In this case, a step in which changes in spectra are saturated indicates an end of cleaning (e.g., all the mass amounts are not always simultaneously increased or decreased, but some of the mass amounts may increase, other some mass amounts may decrease, and further other some mass amounts may repeat an increase and a decrease).

Although the quadruple mass spectrograph is directly placed in the column 81, the spectrograph may be placed in a pipe at a lower position in the down-stream side. If the spectrograph is placed in an exhausting pipe, it is more advantageous in that modification can be easily made. Note that it is necessary to appropriately select the mass amount to be measured. In addition, although the quadruple mass spectrograph 95 is used as an analyzer in the eighth embodiment, the spectrograph may be a mass spectrograph using another kind of principle. In this case, emission spectrum are analyzed with respect to plasma, active species, reactants between plasma and internal contaminants or between active species and internal contaminants. Otherwise, it is possible to use a combination of a mass spectrograph and a laser, or an apparatus which analyses absorption spectrum of plasma, active species, reactants obtained from plasma and internal contaminants, reactants obtained from active species and internal contaminants.

Ninth Embodiment

FIG. 28 is a view schematically showing the structure of an electron beam exposure apparatus having a cleaning function according to the ninth embodiment of the present invention. Note that those portions of this apparatus which correspond to the portions of the apparatus of FIG. 27 are denoted by the same references, and detailed explanation thereof will be omitted herefrom. The electron beam exposure apparatus according to the ninth embodiment differs from the apparatus according to the eighth embodiment in that a spectrograph 98 is used as monitoring means in place of a quadruple mass spectrometer 95. In FIG. 27, reference 99 denotes a controller of the spectrograph 98, and reference 100 denotes a lens having a filter. In the ninth embodiment, an NO gas is used as an assist gas to amplify emission. The NO gas is supplied from an assist gas source 97. In addition, the supply (or flow) amount of an NO gas can be adjusted by the valve 86c.

According to the ninth embodiment, even when small emission is obtained only with oxygen which serves as active species, the entire emission is large by means of reaction between an NO gas and oxygen. Therefore, the amount of oxygen can be estimated. In this case, a step in which the amount of active species (or oxygen), i.e., a change in intensity of emission is saturated is an end of cleaning, like in the preceding embodiment.

Although detection of active species of oxygen is taken into consideration in the ninth embodiment, active species other than oxygen can be detected by selecting an appropriate assist gas with respect to the active species. Of course, where sufficient emission is obtained, an assist gas is not necessary. In addition, an assist solid such as a metal plate or the like which reacts with active species may be provided in place of an assist gas.

Tenth Embodiment

Figure 29:
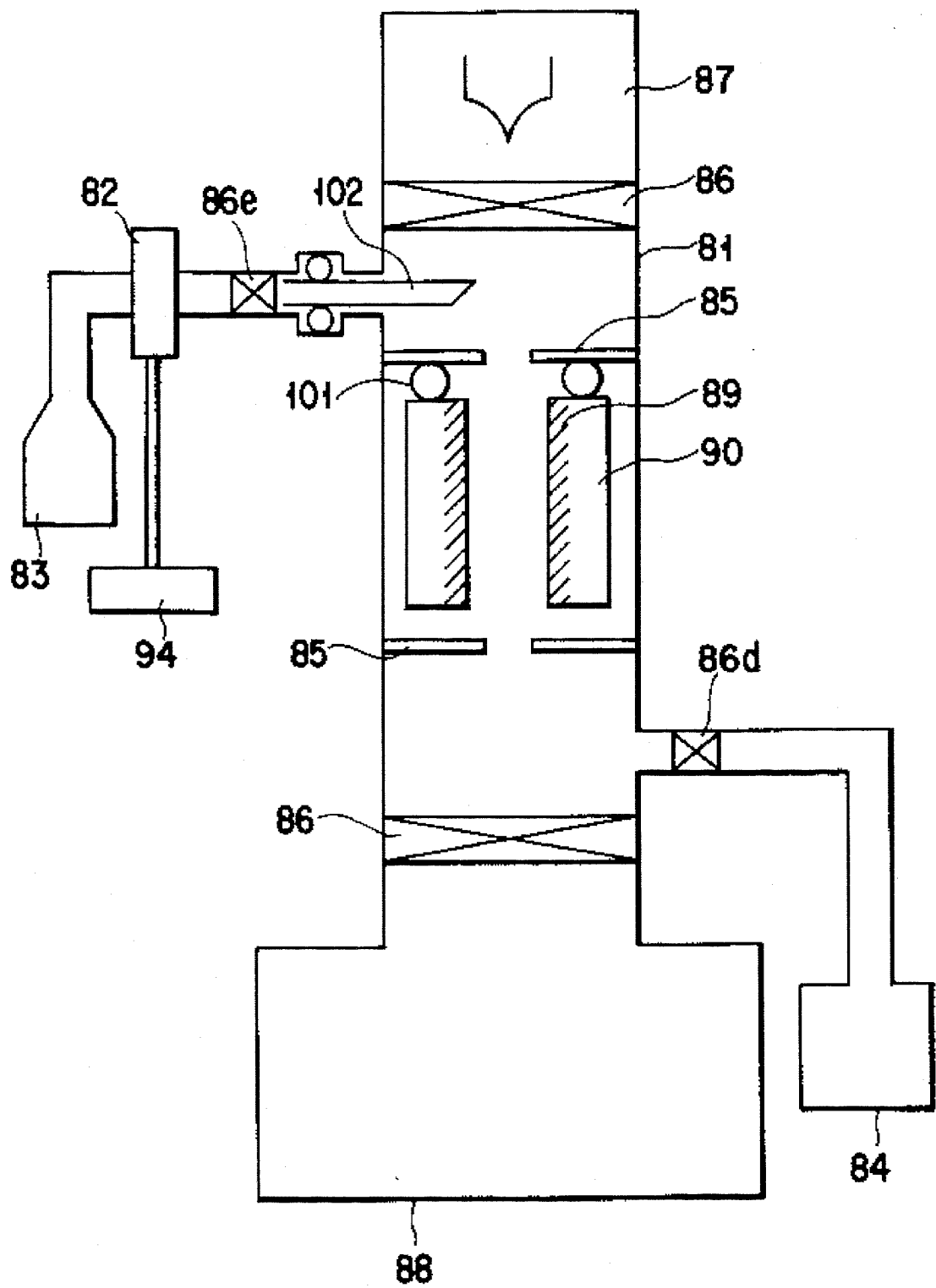
FIG. 29 is a view showing a schematic structure of an electron beam exposure apparatus having a cleaning function provided with a mechanism for cleaning the inside of the column according to the tenth embodiment of the present invention.

FIG. 29 is a view schematically showing the structure of an electron beam exposure apparatus having a cleaning function according to the tenth embodiment of the present invention. Note that those portions of this apparatus which correspond to the portions of the apparatus of FIG. 27 are denoted by the same references, and detailed explanation thereof will be omitted herefrom. In the tenth embodiment, an O-ring 101 is provided between an electrostatic deflector 90 and an aperture 85, thereby restricting the passage of active species. Further, a nozzle 102 is inserted into a column 81. The active species are thereby fed through the nozzle 102 to be close to cleaning portions to be cleaned and are then sprayed. Here, the nozzle 102 should preferably be made of insulating material such as quartz, Teflon, sapphire, ceramics, or the like. This is because active species are difficult to be deactivated in comparison with metal. Further, if the outer surface of the nozzle 102 is coated with conductive material, e.g., gold, charge-up of the nozzle 102 during normal operation can be reduced.

According to the tenth embodiment, the cleaning effect can be improved by limiting the passage of the active species, and the cleaning effect can also be improved still more by using the nozzle 102. This is because, it can be prevented by flowing the active species using the nozzle, that the activity of the active species is lost while they are introduced into the column 81.

Eleventh Embodiment

Figure 30:
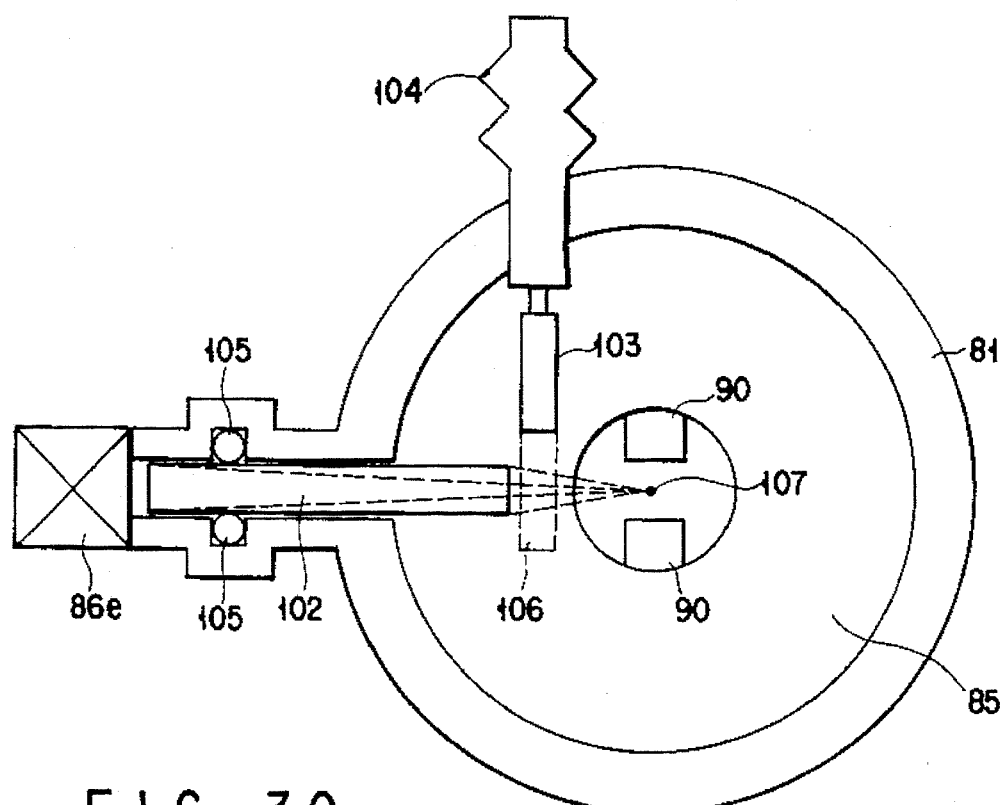
FIG. 30 is a view showing a schematic structure of an electron beam exposure apparatus having a cleaning function provided with a mechanism for cleaning the inside of the column according to the eleventh embodiment of the present invention.

FIG. 30 is a view schematically showing the structure of a main part of an electron beam exposure apparatus according to the eleventh embodiment of the present invention. Note that those portions of this apparatus which correspond to the portions of the apparatus of FIG. 27 are denoted by the same references, and detailed explanation thereof will be omitted herefrom. The electron beam exposure apparatus having a cleaning function according to the eleventh embodiment differs from the apparatus of the tenth embodiment in that a movable nozzle 102 is used. The inner surface of this nozzle 102 is coated with quartz while the outer surface thereof is coated with gold. If a nozzle 102 is movable, the nozzle can be hindered during normal operation and can be inserted into the center portion of the column during cleaning. Note that reference 105 denotes an O-ring. In FIG. 30, a point 107 indicates the center axis of the column 81, i.e., the position of an electron beam. As is indicated by a broken line extending from the center portion 107 of the column 81, the inner surface of the nozzle 102 can be viewed from the center axis 86 of the column 81, i.e., from an electron beam. Therefore, even if the outer surface of the nozzle 102 is coated with metal, the insulating inner surface of the nozzle 102 can be observed from an electron beam, there is a possibility that the inner surface is charged up. The eleventh embodiment uses a shutter 103 which is grounded to an earth and whose surface is coated with conductive material. Specifically, during normal operation, the shutter 103 is moved to the position indicated by a broken line 106, without influencing the vacuum, such that the inner surface of the nozzle 102 cannot be observed from an electron beam of the column 81, thereby preventing the inner surface of the nozzle 102 from being charged up by electrons existing in the electron beam. In addition, for example, gold, platinum, or an alloy of platinum and gold is used as metal for coating the surface of the bellows 104.

Twelfth Embodiment

Figure 31:
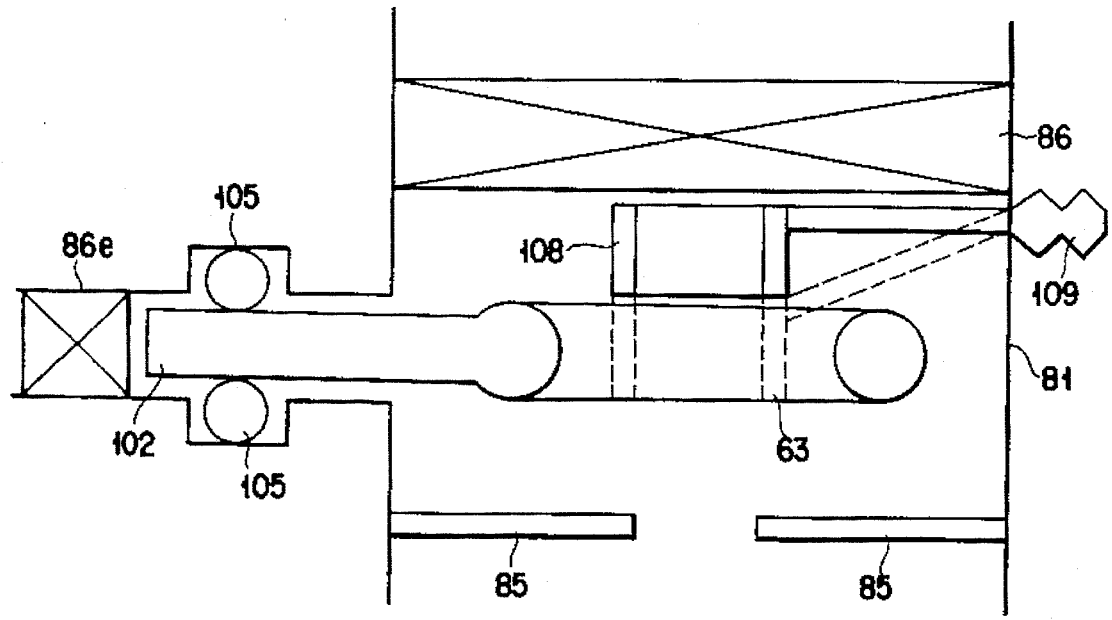
FIG. 31 is a view showing a schematic structure of an electron beam exposure apparatus having a cleaning function provided with a mechanism for cleaning the inside of the column according to the twelfth embodiment of the present invention.

FIG. 31 is a view schematically showing the structure of a main part of an electron beam exposure apparatus having a cleaning function according to the twelfth embodiment of the present invention. Note that those portions of this apparatus which correspond to the portions of the apparatus of FIG. 30 are denoted by the same references, and detailed explanation thereof will be omitted herefrom. The electron beam exposure apparatus having a cleaning function according to the twelfth embodiment differs from the apparatus of the twelfth embodiment in that a donut-shaped nozzle 102 is used as the top portion. A nozzle hole is formed along the inner circumferential surface inside the donut-shaped top portion. A column shutter 108 is used together with this kind of nozzle 102. Specifically, during normal operation, the column shutter 108 is moved to the position indicated by a broken line 110 by the bellows 109, thereby enabling the nozzle 102 to be completely hindered from an electron beam. In addition, when a nozzle having another shape is used or when an insulating member other than a nozzle is required, the insulating member can be prevented from being charged up during normal operation by providing a shutter in an appropriate method corresponding to the shape of the nozzle.

Thirteenth Embodiment

FIG. 32 is a view schematically showing the structure of a main part of an electron beam exposure apparatus having a cleaning function according to the twelfth embodiment of the present invention. Note that those portions of this apparatus which correspond to the portions of the apparatus of FIG. 26 are denoted by the same references, and detailed explanation thereof will be omitted herefrom. In the thirteenth embodiment, a sample made of the same material as that of cleaning portions to be cleaned is used as a sample. In this embodiment, since a main cleaning portion to be cleaned consists of an electrostatic deflector, a dummy electrostatic deflector is used immediately below the main part. Specifically, a dummy electrode 91 made of the same material as that of an electrostatic deflector 90 is provided in the downstream side with respect to the gas flow. The dummy electrode 91 is kept mounted in the column 81 during normal operation, and cleaning is performed when a beam drift appears. Then, a dummy electrode 91 as a sample is taken out during cleaning, and the condition of removal of contaminants is confirmed. In a step in which contaminants do not exist in a dummy electrode 91 any more, cleaning is ended. Although a dummy electrode 91 different from an electrostatic deflector 90 is used in the thirteenth embodiment, the electrostatic deflector 90 may be constructed such that a part of the electrostatic deflector 90 can be conveyed in and out.

According to the thirteenth embodiment, contaminants sticking to the inside of the column 8 are actually removed and estimated, so that completion of cleaning can be determined with high accuracy.

Fourteenth Embodiment

Figure 33:
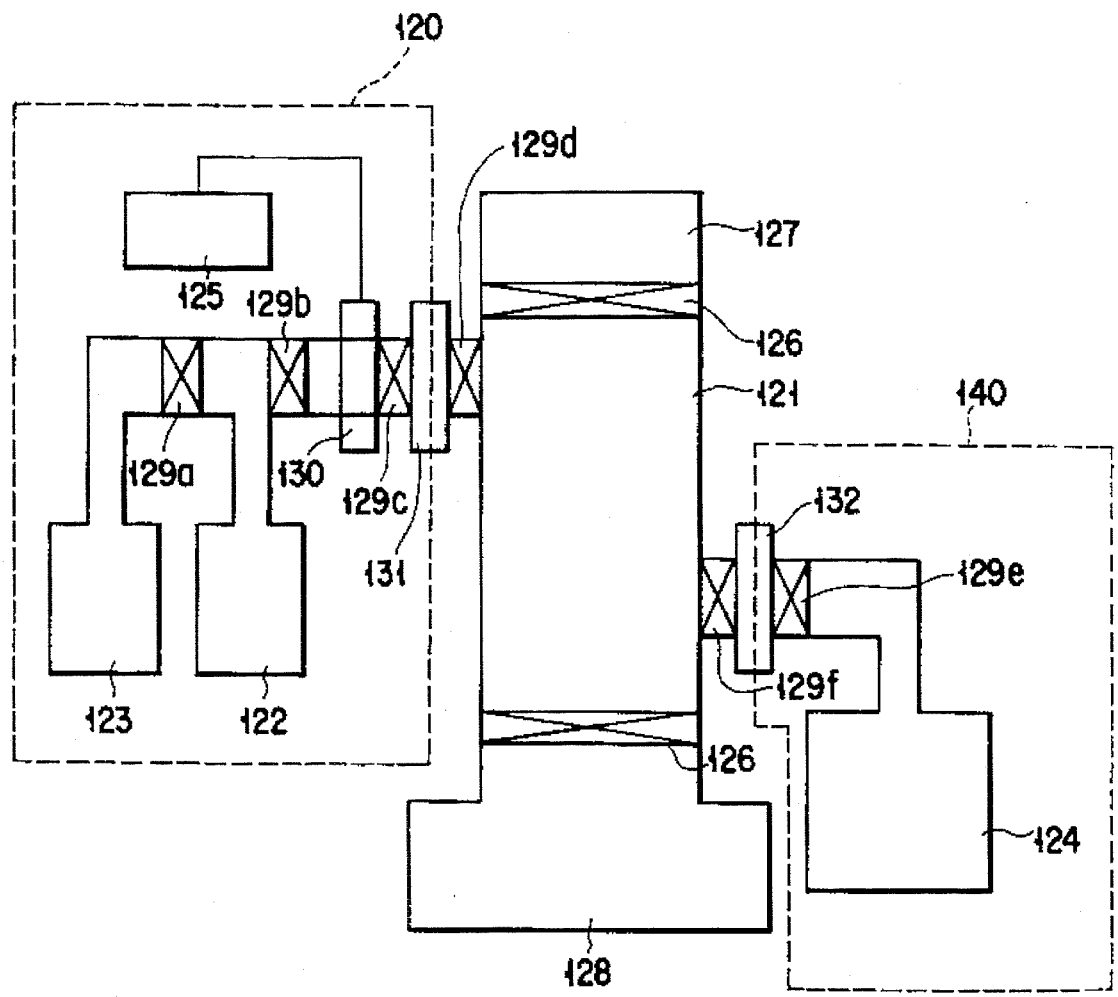
FIG. 33 is a view showing a schematic structure of an electron beam exposure apparatus having a cleaning function.

FIG. 33 is a view schematically showing the structure of an electron beam exposure apparatus having a cleaning function according to the fourteenth embodiment of the present invention. In FIG. 33, a reference 121 denotes a column of an electron beam exposure apparatus, and the column 121 is constructed by a beam generating portion 127 for generating an electron beam and an optical system consisting for controlling deflection of the electron beam. Gate valves 126 are provided above and below the column 121. By these gate valves 126, the inside of the column 121 is separated into a beam generating portion 127 for generating an electron beam, an exposure chamber 128, and the above optical system. In addition, as means for maintaining a differential pressure, an orifice having a sufficiently small conductance and a pump may be used to perform differential exhaustion, to construct such a structure in which a sufficient differential pressure is maintained between the column 121 and the exposure chamber 128. Further, a gas for removing contaminants can be made flow into plasma or active species of $10^{-2}$ to several 10 Torr in the column 121, while maintaining a large part of the column 121 depressurized to a pressure of $10^{-7}$ Torr. As a result, time required for recovering the depressurized pressure after cleaning can be greatly shortened. In FIG. 33, reference 120 denotes a plasma generating portion which is provided outside the column 121 and is detachable from the column 121. This plasma generating portion 120 mainly comprises a first source gas tank 122, a second source gas tank 123, an internal contaminant removal gas generating device 130 for generating plasma or active species from a mixture of source gases of the first and second source gases in the source gas tanks 122 and 123 by means of microwave-excitation or the like, a controller 125 for controlling the internal contaminant removal gas generating apparatus 130, and a detachable portion for forming a part of detach means 131. Note that references 129a to 129c marked in the plasma generating portion 120 denote gate valves. Further, an exhausting portion 140 detachable from the column 121 is provided outside the column 121. This exhausting portion 140 mainly comprises an exhausting pump 124 such as a dry pump or a rotary pump for exhausting a gas and the like contained in the column 121 to the outside, a detachable portion forming a part of detachable portion 132, and a gate valve 129e provided between the detachable portion and the exhausting pump 124. The electron beam exposure apparatus having a cleaning function according to the fourteenth embodiment uses a gas generating portion 120 and an exhausting portion 140 which are provided outside the column 121 and are detachable from the column 121. Therefore, by detaching the gas generating portion 120 and the exhausting portion 140 from the column 121 during normal operation (i.e., during exposure), disadvantageous influences from the gas generating portion 120 and the exhausting portion 140 can be eliminated, so that drawing can be performed with high precision.

Further, if a pair of a gas generating portion 120 and an exhausting portion 140 is commonly occupied by a plurality of electron beam exposure apparatuses each having the same cleaning function, increases in costs can be efficiently prevented. The purpose of reducing costs can be achieved as long as the number of common pairs of gas generating portions 120 and exhausting portions 140 is smaller than the number of used electron beam exposure apparatuses each having a cleaning function.

Furthermore, if the shape of a detachable portion is appropriately selected, a pair of a gas generating portion 120 and an exhausting portion 140 can be commonly occupied by a charged beam apparatus different from an electron beam exposure apparatus having a cleaning function, e.g., by a scanning electron microscope (which will be abbreviated as SEM).

In addition, in this embodiment, if both the gas generating portion 120 and the exhausting portion 140 are not detachable, gate valves 129d and 129f are closed during normal operation. By closing the gate valve 129d, the exhausting pump 124 needs not perform exhaustion of portions concerning the gas generating portion 120, so that exhaustion inside the column 121 can be smoothly performed and the inside of the column 121 can easily be maintained at a high vacuum.

Figure 34:
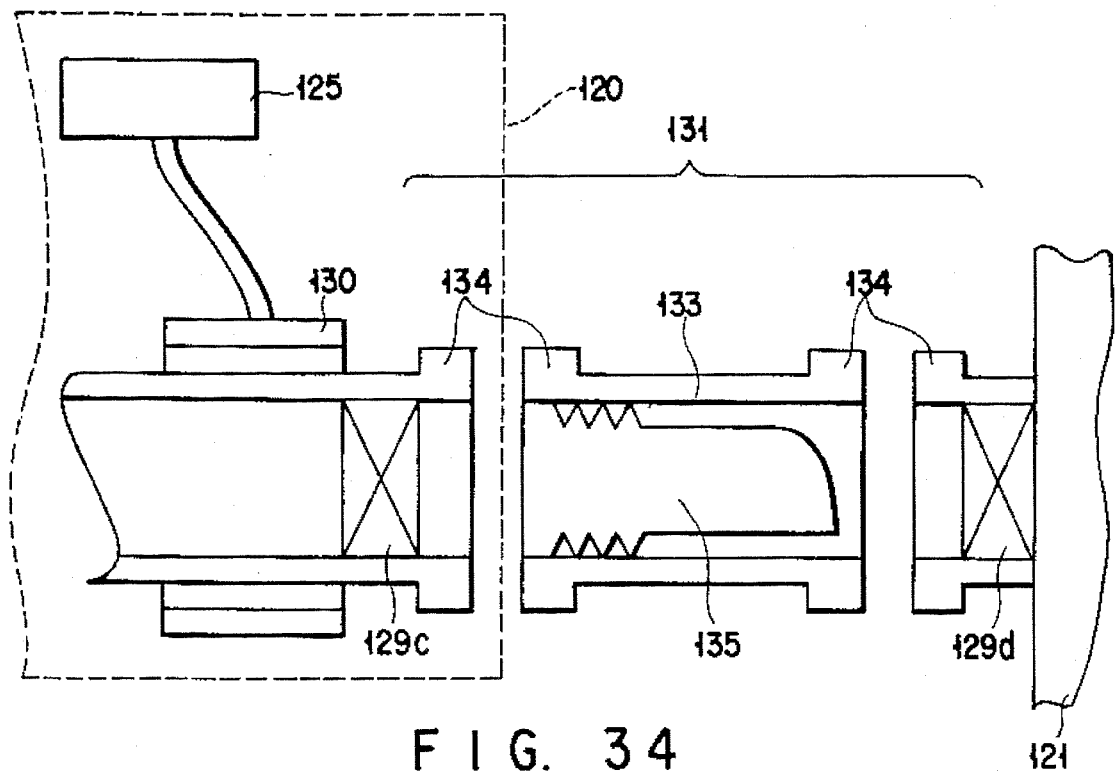
FIG. 34 is a cross sectional view showing a specific structure of attachment/detachment means.

FIG. 34 is a cross-sectional view showing a specific structure of the detachable means 131. In this kind of detach means 131, the detachable portion 134 in the side of the gas generating portion 120 is connected through an adapter 133 to the detachable portion 134 in the side of the column 121. The detachable portion 134 in the side of the gas generating portion 120, the detachable portion 134 in the side of the adapter 133, the detachable portion 134 in the side of the adapter 133, and the detachable portion 134 in the side of the column 121 all have an equal diameter, and thereby, the adapter 133 is detachable from the detachable portion 134 in the side the gas generating portion 120 and from the detachable portion 134 in the side of the column 121. A movable nozzle 135 is provided in the adapter 133. As a result of this, for example, when the inside of the column 121 constitutes a complicated structure, the nozzle 135 is inserted into the center portion of the column, thereby enabling effective cleaning.

In addition, in case of a charged beam apparatus such as an SEM or the like, there is a possibility that the nozzle 135 serves as an obstruct and makes it difficult to connect a gas generating portion 120 with a column 121. In this case, the adapter 133 may be detached and the gas generating portion 120 may be directly connected to the column 121.

When the diameter of the detachable portion 134 is different from the diameter of the detachable portion 134, a diameter change adapter is used in place of an adapter 133, thereby rendering the gas generating portion 120 detachable from the column 121. By thus using an appropriate adapter, the gas generating portion 120 can be made detachable from the column 121 without being influenced by restrictions of the apparatus.

Further, if a gas generating portion 120 independent of the apparatus itself is prepared as shown in FIG. 14a, a cleaning function can easily be realized by connecting a gas generating portion 120 to a conventional port of the charged beam apparatus having no cleaning function. In addition, if there is no conventional port, a cleaning function can be added by a relatively easy modification, for example, by providing a port.

Fifteenth Embodiment

Figure 35:
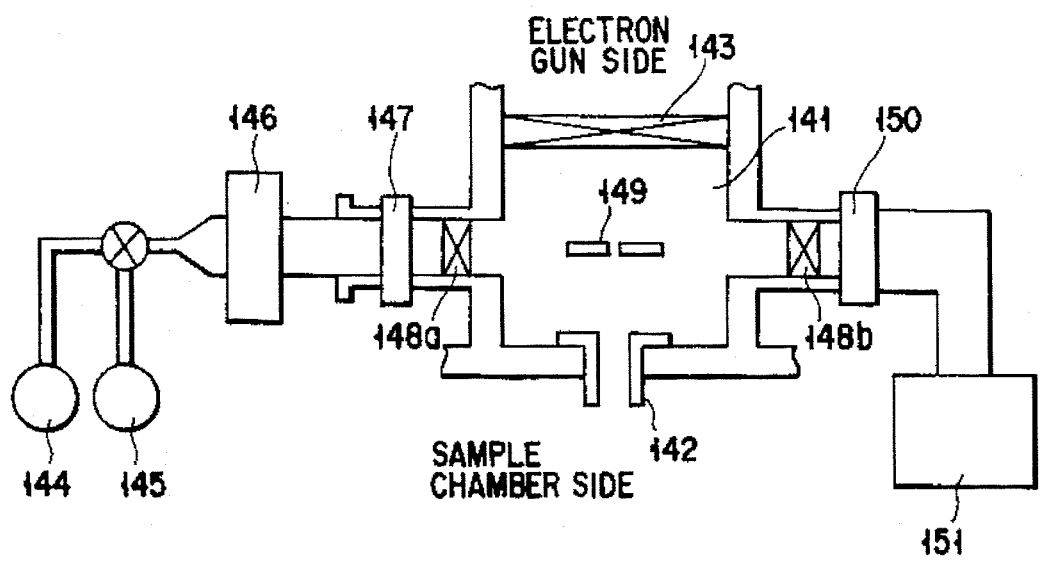
FIGS. 35 is a view showing a schematic structure of an SEM having a cleaning function according to the fifteenth embodiment of the present invention.

FIG. 35 is a view schematically showing the structure of an SEM having a cleaning function according to the fifteenth embodiment of the present invention. In FIG. 35, reference 141 denotes a column of the SEM. This column 141 is separated from the upper electron gun side by a gate valve 143 by means of a vacuum, and is separated from the lower sample side by a sleeve 142 having a small conductance. It is noted that gate value can be used instead of the sleeve. In this column 141, an aperture 149 is provided as a cleaning member. The aperture 149 is retained at a predetermined position by a measure not shown. Meanwhile, a gas generating portion which is used for generating plasma or active species as an internal contaminant removal gas and can be detachable from the column 141 by detach means 147 is provided outside the column 141. This gas generating portion comprises a first source gas tank 144, a second source gas tank 145, a plasma generating apparatus 146, and the likes. Further, an exhausting portion consisting of an exhausting pump 151 for exhausting a gas existing in the column 141 is provided outside the column 141, and this exhausting pump portion is detachable from the column 141 by detach means 150. In FIG. 35, references 148a and 148b denote gate valves, and when the gas generating portion and the exhausting portion are detached from the column 141, these gate valves 148a and 148b are closed thereby to maintain the vacuum in the column 141 at a predetermined level.

The SEM having a cleaning function according to this embodiment is constructed such that the gas generating portion and the exhausting portion can be detached from the column 141. Therefore, the same effects as those obtained by the electron beam exposure apparatus having a cleaning function according to the fourteenth embodiment can be obtained, e.g., the precision during normal operation can be prevented from decreasing, and an increase in costs can be restricted.

With respect to the fifteenth embodiment, explanation has been made to a case where both of the gas generation portion 120 and the exhausting portion 140 are detachable. However, there may be a case that only the gas generating portion 120 is detachable. Further, in the fourteenth and fifteenth embodiments, the entire gas generating portion is provided outside the column, so that the entire gas generating portion is detachable from the column. It is possible to provide only a part (e.g., a plasma generating apparatus and a controller) of the gas generating portion and to make only the other portions detachable from the column. In the same way, only a part of the exhausting portion may be arranged to be detachable.

Sixteenth Embodiment

Figure 36:
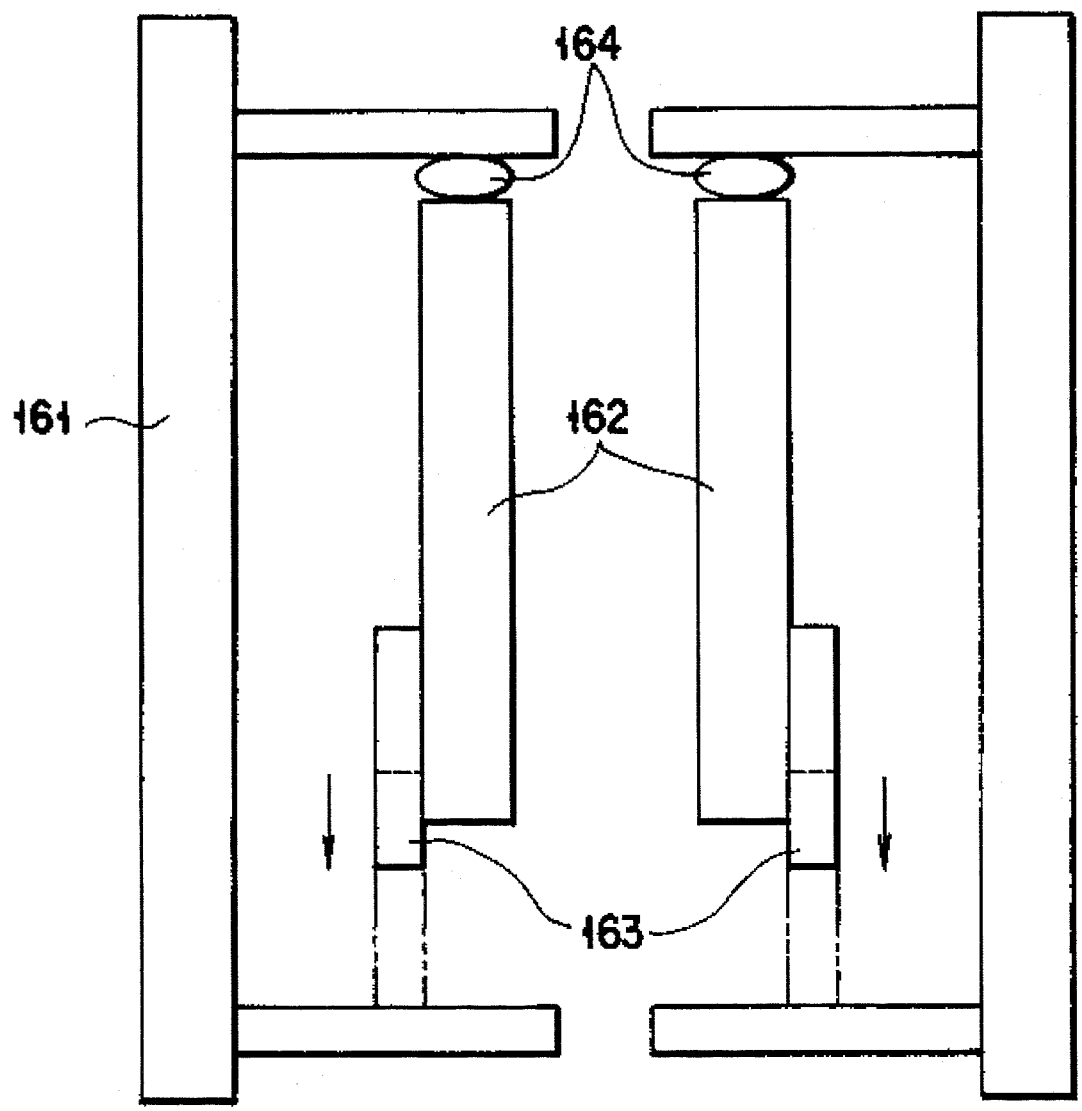
FIG. 36 is a view showing a main part of an electron beam apparatus having a cleaning function according to the sixteenth embodiment of the present invention.

FIG. 36 is a view schematically showing a main portion of an electron beam apparatus having a cleaning function according to the sixteenth embodiment of the present invention. In FIG. 36, reference 161 denotes a column, and a deflection electrode 162 which serves as a cleaning portion to be cleaned is provided in this column 161. Fixed gas flow passage control means 164 such as an O-ring or the like is provided above the deflection electrode. Meanwhile, a movable partition 163 used for corrosion protection is provided below the deflection electrode 162. During normal operation, the partition 163 exists at an upper position (or stand-by position) indicated by a continuous line to smoothly perform vacuum exhausting. When cleaning is performed, the partition 163 is moved to a lower position indicated by a broken line. In this manner, since components which are positioned behind the deflection electrode 162 and should be prevented from corrosion can be protected against active species or plasma, exhausting after cleaning can be smoothly performed.

Although the gas passage control means 161 is fixed in the sixteenth embodiment, this means may be arranged to be movable like the partition 163. In this case, the conductance of a gap after being moved is arranged to be sufficiently small. That is, the flow amount of a gas passing through the gap after being moved is sufficiently small with respect to the flow amount of the gas flowing through cleaning portions to be cleaned.

In addition, the present invention is not limited to the embodiments explained above. For example, in the above embodiments, explanation has been made to a case where the present invention is applied to an electron beam exposure apparatus and an SEM. The present invention, however, is applicable to another charged beam apparatus. Such a charged beam apparatus is, for example, a transparent electron microscope, an analytical electron microscope, a scanning type tunnel microscope, a focusing ion beam apparatus, an electron probe micro-analyzer, an wafer process estimation apparatus, an fine process estimation apparatus, a scanning type ion microscope, or the like.

Further, it is possible to combine the invention of restricting the passage of plasma and the invention of performing cleaning in two stages.

Although explanation has been made to the case of an electron beam exposure apparatus in which the optical system and the exposure chamber are separated from each other while maintaining the vacuum in the above embodiments, the optical system and the exposure chamber need not always be separated from each other by means of a vacuum. When it is desirable to maintain a sufficient differential pressure between the exposure chamber and the column, the differential pressure can be maintained by providing an orifice (or opening) having a sufficiently small exhausting conductance.

In addition, although explanation has been made mainly to a case where a gas mixture of a $CF_4$ gas and an $O_2$ gas is used as a cleaning gas, another cleaning gas which achieves the same effects as the gas mixture may be used. Such another cleaning gas may be, for example, a gas mixture which contains fluorine and oxygen and which consists of gases selected from a group of gases, i.e., an ozone gas, a gas mixture including an ozone gas, an $H_2$ gas, an $NF_3$ gas, a $COF_2$ gas, an $SF_6$ gas, an $H_2O$ gas, and a gas mixture selected from a group of gases.

In the above embodiments, explanation has been made mainly to cases where an O-ring is used as flow passage control means. The O-ring can be substituted by another component as long as the component can control the flow of a gas by maintaining hermeticity.

Further, in the above embodiments, the exposure chamber is arranged under the column. However, the exposure chamber can be placed over the column in the above embodiment.

As has been specifically explained above, according to the present invention, the flow passage control means is provided, so that the flow of a gas can be controlled by this means and the cleaning ability of plasma and active species can be prevented from being reduced. Therefore, cleaning can be efficiently performed. In this manner, the power used for discharging can be reduced and cleaning can efficiently be performed with an apparatus having a simple structure.

In addition, according to the present invention, a gas, which generates a first internal contaminant removal gas consisting of first plasma or active species supplied for removing internal contaminants in a block portion and also generates second plasma or active species for removing internal contaminants formed in the block portion by supplying the first internal contaminant removal gas, is used as a cleaning gas, so that removal of internal contaminants is achieved more completely than in a conventional charged beam apparatus which uses only a first internal contaminant removal gas. As a result, drawing precision can be improved.

In this method, since heating is not necessary, degradation in mechanical precision due to heating needs not be taken into consideration. Further, since a heating mechanism is not required, the structure of the apparatus is simplified.

Further, according to the charged beam apparatus having a cleaning function of the present invention, only the active species can selectively be introduced into the block portion, so that disadvantageous influences supplied by charging particles such as ions or the likes can be eliminated.

In addition, according to the charged beam apparatus having a cleaning function of the present invention, an end of removal of internal contaminants can be precisely determined by monitoring means so that a decrease in the throughput caused by cleaning of the charged beam apparatus can be prevented.

According to the present invention, gas generating means which has at least one portion provided outside the column and detachable from the column is used, so that the mechanical accuracy can be improved by detaching the detachable portion during operation. Further, if one gas generating means is commonly occupied by a plurality of charged beam apparatuses each having a cleaning function, an increase in costs can be prevented.

Further, according to the present invention, cleaning is performed such that an internal contaminant removal gas passes through a predetermined region (i.e., a region through which a charged beam passes and a region into which scattering electrons of the charged beam collide). Therefore, cleaning can be performed efficiently.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A charged beam apparatus having a cleaning function, comprising:

a column including a charged beam generating portion and an optical system for controlling and/or deflecting a charged beam;

a chamber provided to be connected to the column and containing a member to be irradiated with the charged beam;

first separating means for separating the optical system from the charged beam generating portion with respect to vacuum condition; exhausting means for performing exhaustion of a portion partitioned by the first separation means; gas generating means connected to the partitioned portion, for generating an internal contaminant removal gas formed of at least one of plasma and an active species which are supplied to remove internal contaminants from the partitioned portion; and flow passage control means for limiting a passage of the internal contaminant removal gas such that the internal contaminant removal gas is limited to a predetermined cleaning portion which is included in the partitioned portion and surrounding a passage of the charged beam, letting the gas flow therethrough, without fail after the internal contaminant removal gas generated by the gas generating means is introduced into the partitioned portion from the gas generating means and before the gas is exhausted by the exhausting means, the flow passage control means including sealing means hermetically sealing portions other than the predetermined cleaning portion.

2. A charged beam apparatus having a cleaning function according to claim 1, wherein the partitioned portion is divided by a partition having a small exhausting conductance into small divisional portions and that the gas generating means is provided for each of small divisional portions.

3. A charge beam apparatus having a cleaning function according to claim 2, wherein the exhausting means is further provided for each of the small divisional portions.

4. A charged beam apparatus having a cleaning function according to claim 1, further comprising heating means provided along the passage of the internal contaminant removal gas in the partitioned portion, wherein at least one part of surfaces of at least said predetermined cleaning portion of areas through with said internal contaminant removal gas passes is formed of one selected from the group consisting of gold, platinum, palladium, and an alloy thereof.

5. A charged beam apparatus having a cleaning function according to claim 1, further comprising second separating means for separating the optical system from the chamber in which the member is set, with respect to vacuum condition.

6. A charged beam apparatus having a cleaning function according to claim 1, wherein the predetermined cleaning portion includes a region through which the charging beam passes and a region with which scattering electrons caused by the charged beam collide.

7. A charged beam apparatus having a cleaning function according to claim 6, wherein the partitioned portion is divided by a partition having a small exhausting conductance into small divisional portions, that the gas generating means is provided for each of the small divisional portions.

8. A charged beam apparatus having a cleaning function according to claim 6, further comprising heating means provided along the passage of the internal contaminant removal gas in the partitioned portion, wherein at least one part of surfaces comprising at least regions where the charged beam passes and where scattering electrons caused by the charged beam collide is formed of one selected from the group consisting of gold, platinum, palladium, and an alloy thereof.

9. A charged beam apparatus having a cleaning function according to claim 7, wherein the exhausting means is further provided for each of the small divisional portions.

10. A charged beam apparatus having a cleaning function, comprising:
- a column including a charged beam generating portion and an optical system for controlling deflection of a charged beam;
- a chamber provided to be connected to the column and containing a member to be irradiated with the charged beam;
- first separating means for separating the optical system from the charged beam generating portion with respect to vacuum conditions;
- exhausting means for performing exhaustion of a portion partitioned by the first separating means;
- gas generating means connected to the partitioned portion, for generating an internal contaminant removal gas formed of at least one of plasma and an active species which are supplied to remove internal contaminants from the partitioned portion;
- a nozzle for introducing the internal contaminant removal gas from the gas generating means, said nozzle being inserted in the column and a at least one part of the nozzle being formed of insulating material; and
- a movable shutter provided between the nozzle and the charged beam, at least a surface thereof being formed of conductive material.

11. A charged beam apparatus according to claim 10, further comprising second separation means for separating the optical system from the exposure chamber with respect to vacuum condition.

12. A charged beam apparatus having a cleaning function, further comprising:
- a column including a charged beam generating portion and an optical system for controlling deflection of a charged beam;
- a chamber provided to be connected to the column and containing a member to be irradiated with the charged beam;
- first separating means for separating the optical system from the charged beam generating portion with respect to vacuum condition;
- exhausting means for performing exhaustion of a portion partitioned by the first separating means;
- gas generating means connected to the partitioned portion, for generating a first internal contaminant removal gas formed of at least one of plasma and a first active species which are supplied to remove internal contaminants from the partitioned portion, and for generating a second internal contaminant removal gas formed of a second active species which are supplied to remove internal contaminants formed in the partitioned portion due to supply of the first internal contaminant removal gas.

13. A charged beam apparatus having a cleaning function according to claim 12, further comprising second separation means separating the optical system from the chamber in which the member is set, with respect to vacuum condition.

14. A charged beam apparatus having a cleaning function according to claim 12, further comprising flow passage control means for controlling a passage of the first and second internal contaminant removal gases such that the first and second internal contaminant removal gases pass through a predetermined cleaning portion which is included in the optical system and surrounding a passage of the charged beam, being the gas flow therethrough, without fail after the first and second internal contaminant removal gases generated by the gas generating means are introduced into the partitioned portion from the gas generating means and before the gases are exhausted by the exhausting means.

15. A charged beam apparatus having a cleaning function according to claim 14, wherein surfaces of at least said predetermined cleaning portion of area through which said internal contaminant removal gas passes are formed of one selected from the group of gold, platinum, palladium, and an alloy thereof, and that a source gas which serves as the second internal contaminant removal gas is one selected from the group of $H_2O$, $N_2$, $H_2$, a rare gas, and a gas mixture thereof.

16. A charged beam apparatus having a cleaning function, comprising:
- a column including a charged beam generating portion and an optical system for controlling deflection of a charged beam;
- a chamber provided to be connected to the column and containing a member to be irradiated with the charged beam;
- first separating means for separating the optical system from the charged beam generating portion with respect to vacuum condition;
- exhausting means for performing exhaustion of a portion partitioned by the first separating means;
- gas generating means connected to the separated partitioned portion, for generating a first internal contaminant removal gas formed of at least one of first plasma and a first active species which are supplied to remove internal contaminants from the partitioned portion, and for generating a second internal contaminant removal gas formed of at least one of second plasma and a second active species which are supplied to remove internal contaminants formed in the partitioned portion due to supply of the first internal contaminant removal gas, wherein at least one part of surfaces of at least said predetermined cleaning portion of areas through which said internal contaminant removal gas passes is formed one selected from the group of gold, platinum, palladium, and an alloy thereof included in the optical system and surrounding a passage of the charged beam, being the gas flow therethrough.

17. A charge beam apparatus having a cleaning function according to claim 16, wherein a source gas which serves as the second internal contaminant removal gas is one of selected from the group of $H_2O$, $N_2$ and a rare gas.

18. A charged beam apparatus having a cleaning function, comprising:

a column including a charged beam generating portion and an optical system for controlling deflection of a charged beam;

a chamber provided to be connected to the column and containing a member to be irradiated with the charged beam;

first separating means for separating the optical system with respect to vacuum condition;

active species generating means provided outside the column so as to be connected to the partitioned portion, for subjecting an active species source gas to plasma-discharging and for generating an active species supplied to remove internal contaminants in the partitioned portion; and active species introducing means for generating an electrostatic field and for selectively introducing only the active species.

19. A charged beam apparatus having a cleaning function according to claim 18, further comprising second separation means for separating the optical system from the chamber in which the member is set, with respect to vacuum condition.

20. A charged beam apparatus having a cleaning function, comprising:

a column including a charged beam generating portion and an optical system for controlling deflection of a charged beam;

a chamber provided to be connected to the column and containing a member to be irradiated with the charged beam;

first separating means for separating the optical system from the charged beam generating portion with respect to vacuum condition;

exhausting means for performing exhaustion of a portion partitioned by the first separating means;

gas generating means connected to the partitioned portion, for generating an internal contaminant removal gas formed of at least one of plasma and an active species which are supplied to remove internal contaminants from the partitioned portion; and monitoring means for monitoring a degree of accomplishment of removal of the internal contaminants.

21. A charged beam apparatus having a cleaning function according to claim 20, wherein the monitoring means is provided at a downstream position of the passage for the internal contaminant removal gas in the partitioned portion after the cleaning portion is cleaned by the internal contaminant removal gas.

22. A charged beam apparatus having a cleaning function according to claim 20, wherein the monitoring means comprises a sample for measuring a degree of accomplishment of removal of the internal contaminants, and means for moving the sample into and out of the partitioned portion while maintaining the vacuum condition in the partitioned portion.

23. A charged beam apparatus having a cleaning function according to claim 20, wherein the monitoring means comprises measurement means for measuring an amount of at least one of an active species, plasma, a reactant obtained between the internal contaminants and the active species, and a reactant obtained between the internal contaminants and the plasma in the partitioned portion.

24. A charged beam apparatus having a cleaning function according to claim 20, further comprising second separating means for separating the optical system from the chamber in which the member is set, with respect to vacuum condition.

25. A charged beam apparatus having a cleaning function, comprising:

a column including a charged beam generating portion and an optical system for controlling deflection of a charged beam;

a chamber provided to be connected to the column and containing a member to be irradiated with the charged beam;

first separating means for separating the optical system from the charged beam generating portion with respect to vacuum condition;

exhausting means for performing exhaustion of a portion partitioned by the first separating means, the exhausting means having at least a portion which is provided outside the column;

gas generating means connected to the partitioned portion, for generating an internal contaminant removal gas formed of at least one of plasma and an active species which are supplied to remove internal contaminants from the partitioned portion, the gas generating means being provided to be detachable from the column by a third separating means; and flow passage control means for limiting a passage of the internal contaminant removal gas such that the internal contaminant removal gas is limited to a predetermined cleaning portion which is included in the partitioned portion and surrounding a passage of the charged beam, letting the gas flow therethrough, without fail after the internal contaminant removal gas generated by the gas generating means is introduced into the partitioned portion from the gas generating means and before the gas is exhausted by the exhausting means, the flow passage control means including sealing means hermetically sealing portions other than the predetermined cleaning portion.

26. A charged beam apparatus having a cleaning function according to claim 25, wherein the exhausting means is detachable from the column by a fourth separating means.

27. A charged beam apparatus having a cleaning function according to claim 25, further comprising second separating means for separating the optical system from the chamber in which the member is set, with respect to vacuum condition.

28. A method of cleaning a charged beam apparatus, having a column composed of a charged beam generating portion and an optical system portion for controlling deflection of a charged beam, the optical system portion being partitioned from the charged beam generating portion by separating means, comprising the steps of:

supplying a cleaning gas from cleaning gas supply means to gas generating means;

exciting the supplied cleaning gas by using gas generating means, generating an internal contaminant cleaning gas including at least one of plasma and an active species, and introducing the internal contaminant cleaning gas into the partitioned portion of the column;

controlling a flow passage such that the introduced internal contaminant cleaning gas passes through a predetermined cleaning portion which surrounds a passage of the charged beam in the partitioned portion of the column, and portions other than the cleaning portion in the column are sealed hermetically to let the gas pass through the predetermined cleaning portion without fail;

cleaning internal contaminants sticking to the predetermined cleaning portion in the partitioned portion of the column with use of the internal contaminant cleaning gas; and exhausting the internal contaminant cleaning gas and the internal contaminants to the outside of the apparatus through exhausting means after cleaning.

29. A method of cleaning a charged beam apparatus according to claim 28, wherein the predetermined cleaning portion includes a region where the electron beam passes and a region to which scattering electrons caused by the charged beam collide.

30. A method of cleaning a charged beam apparatus, having a column composed of a charged beam generating portion and an optical system portion for controlling deflection of a charged beam, comprising steps of:

supplying a first cleaning gas pre-cleaning from first cleaning gas supply means to gas generating means;

exciting the supplied first cleaning gas by using gas generating means, generating a first internal contaminant cleaning gas including at least one of plasma and an active species, and introducing the internal contaminant cleaning gas into the column;

pre-cleaning internal contaminants sticking to a predetermined cleaning portion in the column with use of the introduced first internal contaminant cleaning gas;

exhausting the first internal contaminant cleaning gas and the internal contaminants through exhausting means to outside of the apparatus after the pre-cleaning step;

supplying a second cleaning gas for after-cleaning from second cleaning gas supply means to the column;

exciting the supplied second cleaning gas with use of gas generating means, generating a second internal contaminant cleaning gas including at least one of plasma and an active species, and introducing the internal contaminant cleaning gas into the column;

after-cleaning the internal contaminants sticking to the predetermined cleaning portion in the column with use of the introduced second internal contaminant cleaning gas; and exhausting the second internal contaminant cleaning gas and the internal contaminants through the exhausting means to outside of the apparatus after the after-cleaning step.

* * * * *